US011837283B2

(12) United States Patent
Smith

(10) Patent No.: US 11,837,283 B2
(45) Date of Patent: *Dec. 5, 2023

(54) HIGH VOLTAGE SWITCH WITH MITIGATED GATE STRESS

(71) Applicant: Micron Technology, Inc., Boise, ID (US)

(72) Inventor: Michael Andrew Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/896,854

(22) Filed: Aug. 26, 2022

(65) Prior Publication Data

US 2022/0415390 A1    Dec. 29, 2022

Related U.S. Application Data

(63) Continuation of application No. 17/244,501, filed on Apr. 29, 2021, now Pat. No. 11,443,798.

(51) Int. Cl.
| | |
|---|---|
| *G11C 16/06* | (2006.01) |
| *G11C 11/56* | (2006.01) |
| *H03K 17/10* | (2006.01) |
| *G11C 5/14* | (2006.01) |
| *G11C 16/08* | (2006.01) |

(52) U.S. Cl.
CPC .......... *G11C 11/5635* (2013.01); *G11C 5/145* (2013.01); *G11C 11/5642* (2013.01); *G11C 16/06* (2013.01); *G11C 16/08* (2013.01); *H03K 17/102* (2013.01)

(58) Field of Classification Search
CPC ..... G11C 16/0483; G11C 16/06; G11C 16/08; G11C 16/30; G11C 5/145
See application file for complete search history.

(56) References Cited

U.S. PATENT DOCUMENTS

2011/0157984 A1\* 6/2011 Chung ................... G11C 16/08
                                                                365/185.05
2020/0243142 A1\* 7/2020 Yamada ............. G11C 16/0466

OTHER PUBLICATIONS

U.S. Appl. No. 17/244,501, Non Final Office Action dated Apr. 15, 2022, 12 pgs.

(Continued)

*Primary Examiner* — Alfredo Bermudez Lozada
(74) *Attorney, Agent, or Firm* — Schwegman Lundberg & Woessner, P.A.

(57) ABSTRACT

A variety of applications can include a high voltage switch configured to translate supply voltages or other voltages to specific magnitudes in memory devices, with the high voltage switch designed to provide enhanced lifetime of components of the high voltage switch. A high voltage switch can include a high voltage diode coupled to an output node and to a gate of a high voltage transistor coupled to the output node. The high voltage diode can provide feedback of an output voltage to the gate of the high voltage transistor to relieve Fowler-Nordheim stress on the dielectric coupled to the gate in the transistor, where large shifts in threshold voltage of the transistor could otherwise result from the Fowler-Nordheim stress. The high voltage diode can be structured using a high voltage field effect transistor. Additional devices, systems, and methods are discussed.

20 Claims, 13 Drawing Sheets

(56) References Cited

OTHER PUBLICATIONS

U.S. Appl. No. 17/244,501, Response filed Apr. 29, 2022 to Non Final Office Action dated Apr. 15, 2022, 13 pgs.
U.S. Appl. No. 17/244,501, Notice of Allowance dated May 11, 2022, 9 pgs.

* cited by examiner

HIGH VOLTAGE SWITCH WITH MITIGATED GATE STRESS

PRIORITY APPLICATION

This application is a continuation of U.S. application Ser. No. 17/244,501, filed Apr. 29, 2021, which is incorporated herein by reference in its entirety.

FIELD OF THE DISCLOSURE

Embodiments of the disclosure relate generally to circuits, and more specifically, to circuits in memory systems.

BACKGROUND

Memory devices are typically provided as internal, semiconductor, integrated circuits in computers or other electronic devices. There are many different types of memory, including volatile and non-volatile memory. Volatile memory requires power to maintain its data and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

A high voltage (HV) switch, which is also referred to as a high voltage level shifter, is used in many memory devices to shift a voltage to one or more memory cells in a memory device to a higher level for one or more operations such as program and erase operations. The HV switch has a number of components, where stress on one or more of these components from operation by the HV switch can be quite large to a point at which the stress can limit the lifetime of these components, and, hence the HV switch. Enhancements to a HV switch can provide for better operation of a device, such as a memory device, with which the HV switch is used.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
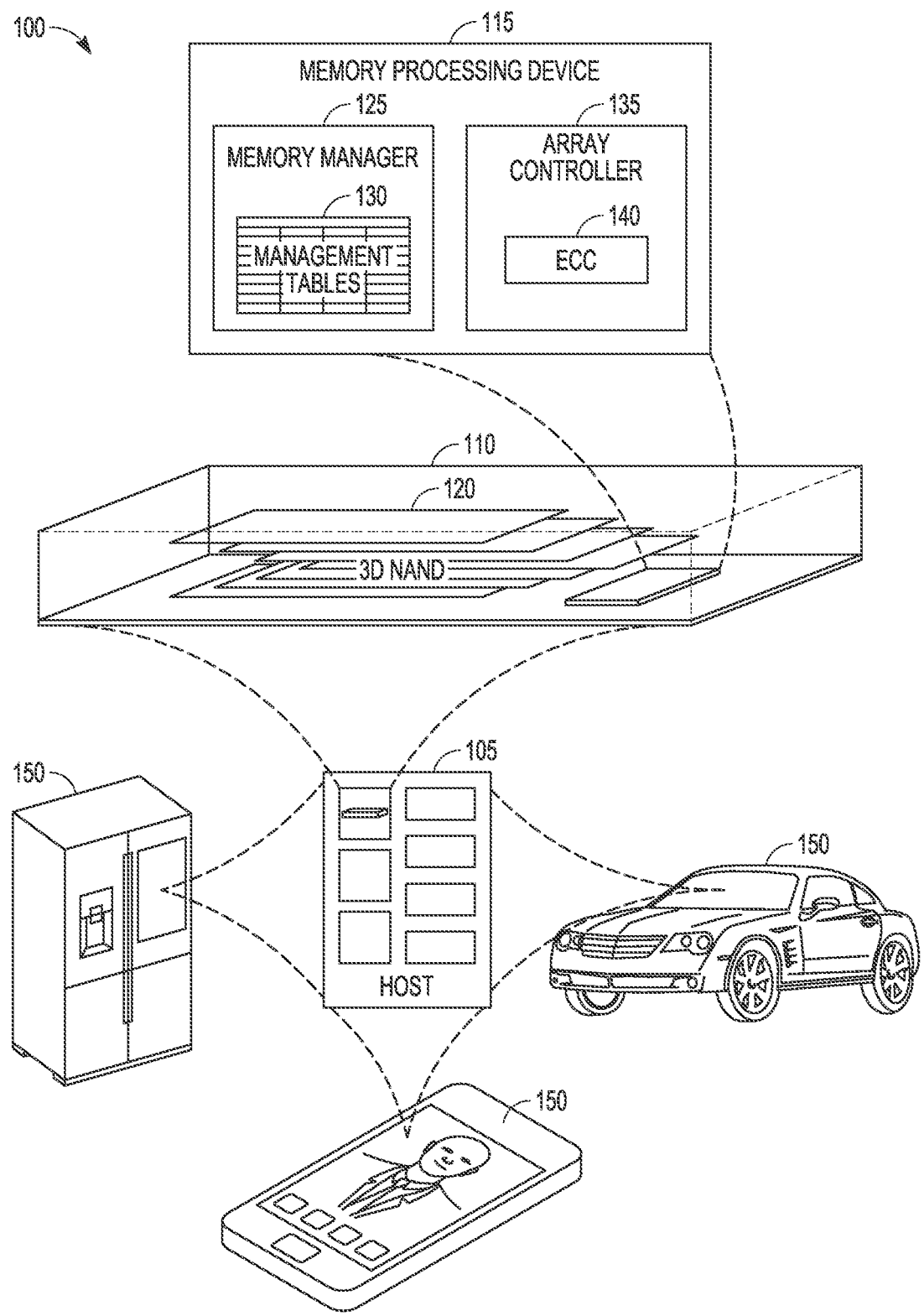
FIG. 1 illustrates an example of an environment including a memory device, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

HV switch circuits have been used in various memory devices, for example, NAND flash memory devices, to provide desired voltages at different magnitudes to selectively operate a memory cell, such as read, program, or erase a memory cell. In a memory device, components or subcircuits may have different voltage requirements to fulfill respective functions. A HV switch circuit can serve as an interface between different logic device components to translate signals from one logic level or voltage domain to another logic level or voltage domain, thereby enabling compatibility among the voltage levels of different components or subcircuits. Providing appropriate operating voltages to specific circuit components can increase reliability of a memory device and decrease power consumption.

A standard HV switch circuit, which is used with a memory device, involves a HV p-type field effect transistor (HVP) that suffers significant shift in threshold voltage (Vt) due to Fowler-Nordheim (FN) stress. The memory device can include a memory array arranged as one or more blocks of memory cells. High voltage is defined by the application of the HV switch. With the HV switch implemented with a memory device, HV is defined by one or more operations of the memory device. For a NAND memory device, these high voltages are voltages used for the NAND memory cell program and erase operations. These high voltages are typically generated by onboard charge pumps. HV can range from about 20 V to about 32 V. The low voltages of the NAND memory device are logic voltages being less than or equal to about 3.3 V. The low voltages can be typically be provided by external power sources of less than or equal to 3.3V.

Fowler-Nordheim refers to a field emission tunneling process in which electrons tunnel through a barrier in the presence of a high electric field. In an insulated gate field-effect transistor, the barrier is a thin dielectric between a channel structure, which can conduct electrical carriers, and a gate or charge trap region. The thin dielectric can be an insulating oxide. The stress can be quite large such that the HV switch cannot turn on without additional circuitry to either assist with turn-on, such as an assist HV device, or stress relief circuitry for the dielectric barrier of the HVP that bumps up the gate voltage to the HVP after turn-on of the HV switch has been initiated. Even with these features, the lifetime can be limited, which can lead to undertaking careful consideration in design and operation, especially for certain circuits such as upstream switches for providing a programming voltage, Vprog, that are activated for each block of a memory array during programming of these blocks.

In various embodiments, a HV switch (level shifter) based on using a HVP includes a HV diode to couple an output node of the HV switch to a gate of the HVP, which provides an output voltage of the HV switch to the gate of the HVP in order to relieve the FN stress on the dielectric contacting the channel structure of the HVP, which would otherwise result in large shifts in Vt from FN stress. The HV diode can be implemented as a HV field effect transistor (FET) in diode mode. The HV FET can be wired in diode configuration. The gate voltage of the HVP follows the output voltage with a voltage diode drop of the diode, resulting in the voltage across the dielectric not being in the FN regime and the lifetime is indefinite. The FN regime is a voltage range that basically forces current through the dielectric contacting the channel structure. By coupling the HVP gate to the output voltage with a diode, there is only the diode's voltage drop across the HVP dielectric to its channel structure, which can result in essentially zero FN stress and infinite lifetime relative to FN stress. Consequently, this circuit can function as a universal solution and reduce engineering resources otherwise required for analysis and mitigation of such problems associated with a threshold voltage associated with a device subject to FN emission.

In embodiments utilizing a feedback diode coupled to the output of a HV switch using a HVP at the output section of the HV switch, when the HV switch is turned on and the output voltage Vout of the HV switch increases, the gate voltage of the HVP can be pulled up to Vout−Vdiode, where Vdiode is the voltage drop across the diode. The diode can be arranged in the HV circuit such that the Vdiode is about 3-4 volts to allow for the channel structure of the HVP to remain turned on. The voltage drop of the diode can be placed in the 3-4V range to assure the HVP remains turned on during initial turn-on. With this arrangement of the HV switch, during the entire activation of the switch, the voltage across the dielectric of the HVP does not exceed this voltage, preventing the voltage across the dielectric from being biased into the FN regime. The prevention of the voltage across the dielectric from being biased into the FN regime also prevents the HVP from suffering associated Vt shifts such that the lifetime of the HVP would essentially be infinite with respect to FN emission.

The diode of a HV switch based on using a HVP can be implemented by a HV n-type field effect transistor (HVN) with a combination of standard implant dopants for a n-type FET or structured with additional implant dopants for high Vt. A second diode, which can be structured as a HV FET in diode mode or wired in a diode configuration, can be placed in the HV switch between bias circuitry for the gate of the HVP for protection, while still allowing application of an off voltage to the gate of the HVP during the time when the switch is turned off.

The gate of the HVP can be to be coupled to a rail network to allow for the initial grounding of the gate of the HVP gate during initiation of the HV switch being turned-on. The rail network can provide a rail voltage. The rail voltage can be set to a voltage Vsg, which can be applied between a source and a gate. The initial grounding of the gate of the HVP gate during initiation can be accomplished with another HV diode, which can be structured as a HV FET in diode mode or wired in a diode configuration, in addition to the feedback HV diode. Variants can be made to the structure of two example configurations. The structure of the first example configuration can include an HVN in wired diode configuration with a Vsg input such that the gate of the HVP gate is maintained biased to Vsg. An assist HV depletion mode transistor (HVD) can be used in this first configuration. The structure of the second example configuration can include a HVN having a gate biased to Vsg and a drain switchable between Vsg and 0V, where for such voltage connections to Vs this HVN can be viewed as a Vsg diode. The drain can be set to ground during turn-on initiation, forcing the gate of the HVP to ground, and can also serve as a discharge path from a node coupled to the gate of the HVP. In the second example configuration, this HVN can be weak. because it is used to discharge the capacitance at the node coupled to the gate of the HVP and should not significantly pull down the voltage at the node coupled to the gate of the HVP, if there is a transient contention state with the pull-up by the diode providing feedback from the output node of the HV switch. The components of the HV switch circuit are HV devices by their structural properties such as, for transistors, dopant level forming the carrier-type (n-type or p-type) device and width-to-length (W/L) ratio of its channel structure, among other things.

Discharge of the capacitance at the node for the gate of the HVP can be accomplished by various mechanisms. In one example mechanism, an additional discharge FET can be utilized in parallel with the Vsg diode. In a second example mechanism, the Vsg diode itself can be arranged having a terminal grounded such as being source-grounded when implemented using a FET.

Memory devices can include individual memory die, which may, for example, include a storage region comprising one or more arrays of memory cells, implementing one (or more) selected storage technologies. Such memory die will often include support circuitry for operating the memory array(s). Other examples, sometimes known generally as "managed memory devices," include assemblies of one or more memory die associated with controller functionality configured to control operation of the one or more memory die. Such controller functionality can simplify interoperability with an external device, such as a host. In such managed memory devices, the controller functionality may be implemented on one or more dies also incorporating a memory array or on a separate die. In other examples, one or more memory devices may be combined with controller functionality to form a solid-stage drive (SSD) storage volume.

Both NOR and NAND flash architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC has been referred to as a memory cell that can store two bits of data per cell (e.g., one of four programmed states). MLC is used herein in its broader context, to refer to any memory cell(s) that can store more than one bit of data per cell (i.e., that can represent more than two programmed states). Herein, a memory cell that can store two bits of data per cell (e.g., one of four programmed states) can be referred to as a duo-level cell (DLC). A triple-level cell (TLC) can refer to a memory cell that can store three bits of data per cell (e.g., one of eight programmed states). A quad-level cell (QLC) can store four bits of data per cell, and a penta-level cell (PLC) can store five bits of data per cell.

Managed memory devices may be configured and operated in accordance with recognized industry standards. For example, managed NAND devices may be (as non-limiting examples), a Universal Flash Storage (UFS™) storage device, or an embedded MMC device (eMMC™), etc. For example, in the case of the above examples, UFS devices may be configured in accordance with Joint Electron Device Engineering Council (JEDEC) standards (e.g., JEDEC standard JESD223D, entitled "JEDEC UFS Flash Storage 3.0," and/or updates or subsequent versions to such standard). Similarly, identified eMMC devices may be configured in accordance with JEDEC standard JESD84-A51, entitled "JEDEC eMMC standard 5.1," and/or updates or subsequent versions to such standard.

An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells, to obviate internal battery supply requirements, thus allowing the drive to be more versatile and compact. Managed NAND devices can be used as primary or ancillary memory in various forms of electronic devices and are commonly used in mobile devices.

Both SSDs and managed memory devices can include a number of memory devices, including a number of dies or logical units (e.g., logical unit numbers or LUNs), and can include one or more processors or other controllers performing logic functions used to operate the memory devices or interface with external systems. Such SSDs and managed memory devices can include one or more flash memory die, including a number of memory arrays and peripheral circuitry thereon. The flash memory arrays can include a number of blocks of memory cells organized into a number of physical pages. In some examples, the SSDs can also include DRAM or static random-access memory (SRAM) (or other forms of memory die or other memory structures). Similarly, managed NAND devices can include one or more arrays of volatile and/or nonvolatile memory separate from the NAND storage array and either within or separate from a controller. Both SSDs and managed NAND devices can receive commands from a host in association with memory operations, such as read or write operations, to transfer data (e.g., user data and associated integrity data, such as error data and address data, etc.) between the memory devices and the host, or erase operations to erase data from the memory devices.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., Internet-of-Things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, an SSD, an MMC, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor, or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as IoT devices (e.g., a refrigerator or other appliance, sensor, motor or actuator, mobile communication device, automobile, drone, etc.) to support processing, communications, or control of the product 150.

The memory device 110 includes a memory processing device 115 and a memory array 120 including, for example, a number of individual memory die (e.g., a stack of 3D NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a UFS interface, an eMMC™ interface, or one or more other connectors or interfaces. The host device 105 can include a host system, an electronic device, a processor, a memory card reader, or one or more other electronic devices external to the memory device 110. In some examples, the host device 105 may be a machine having some portion, or all, of the components discussed in reference to the machine 1300 of FIG. 13.

The memory processing device 115 can receive instructions from the host device 105, and can communicate with the memory array 120, such as to transfer data to (e.g., write or erase) or from (e.g., read) one or more of the memory cells, planes, sub-blocks, blocks, or pages of the memory array 120. The memory processing device 115 can include, among other things, circuitry or firmware, including one or more components or integrated circuits. For example, the memory processing device 115 can include one or more memory control units, circuits, or components configured to control access across the memory array 120 and to provide a translation layer between the host device 105 and the memory device 110. The memory processing device 115 can include one or more input/output (I/O) circuits, lines, or interfaces to transfer data to or from the memory array 120. The memory processing device 115 can include a memory manager 125 and an array controller 135.

The memory manager 125 can include, among other things, circuitry or firmware, such as a number of components or integrated circuits associated with various memory management functions. In some embodiments, the functions of the memory manager 125 are implemented by a controller (or processor) executing the instructions of firmware. For example, memory manager 125 can, in some examples, be implemented at least in part by one or more processors, which may execute instructions stored in memory. The management tables 130 can be similarly be stored on the memory processing device 115, in either of such memory device locations. In other examples the instructions and/or management tables 130 may be stored in certain blocks of the NAND die stack and loaded into the working memory of memory processing device 115 during operation. Those skilled in the art will recognize that, in some examples, the components and functions of memory manager 125 and array controller 135 can be implemented by any combination of components (or subsets thereof) described herein and may include additional hardware components.

For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more components of the memory device 110 (e.g., various information associated with a memory array or one or more memory cells coupled to the memory processing device 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory processing device 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory processing device 115. The memory operations can be based on, for example, host commands received from the host device 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory processing device 115. The memory processing device 115 can be configured to actively detect and recover from error occurrences (e.g., bit errors, operation errors, etc.) associated with various operations or storage of data, while maintaining integrity of the data transferred between the host device 105 and the memory device 110, or maintaining integrity of stored data (e.g., using Redundant Array of Independent Disks (RAID) storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB DLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the write time and twice the program/erase (PIE) cycles as a corresponding TLC memory device. Other examples can include other numbers or arrangements. In some examples, a memory device, or a portion thereof, may be selectively operated in SLC mode or in a desired MLC mode (such as TLC, QLC, etc.).

In operation, data is typically written to or read from the NAND memory device 110 in pages and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes or may require different amounts of metadata associated therewith. For example, different memory device types may have different bit error rates, which can lead to different amounts of metadata to ensure integrity of the page of data (e.g., a memory device with a higher bit error rate may require more bytes of error correction code data than a memory device with a lower bit error rate). As an example, a MLC NAND flash device may have a higher bit error rate than a corresponding SLC NAND flash device. As such, the MLC device may require more metadata bytes for error data than the corresponding SLC device.

Figure 2:
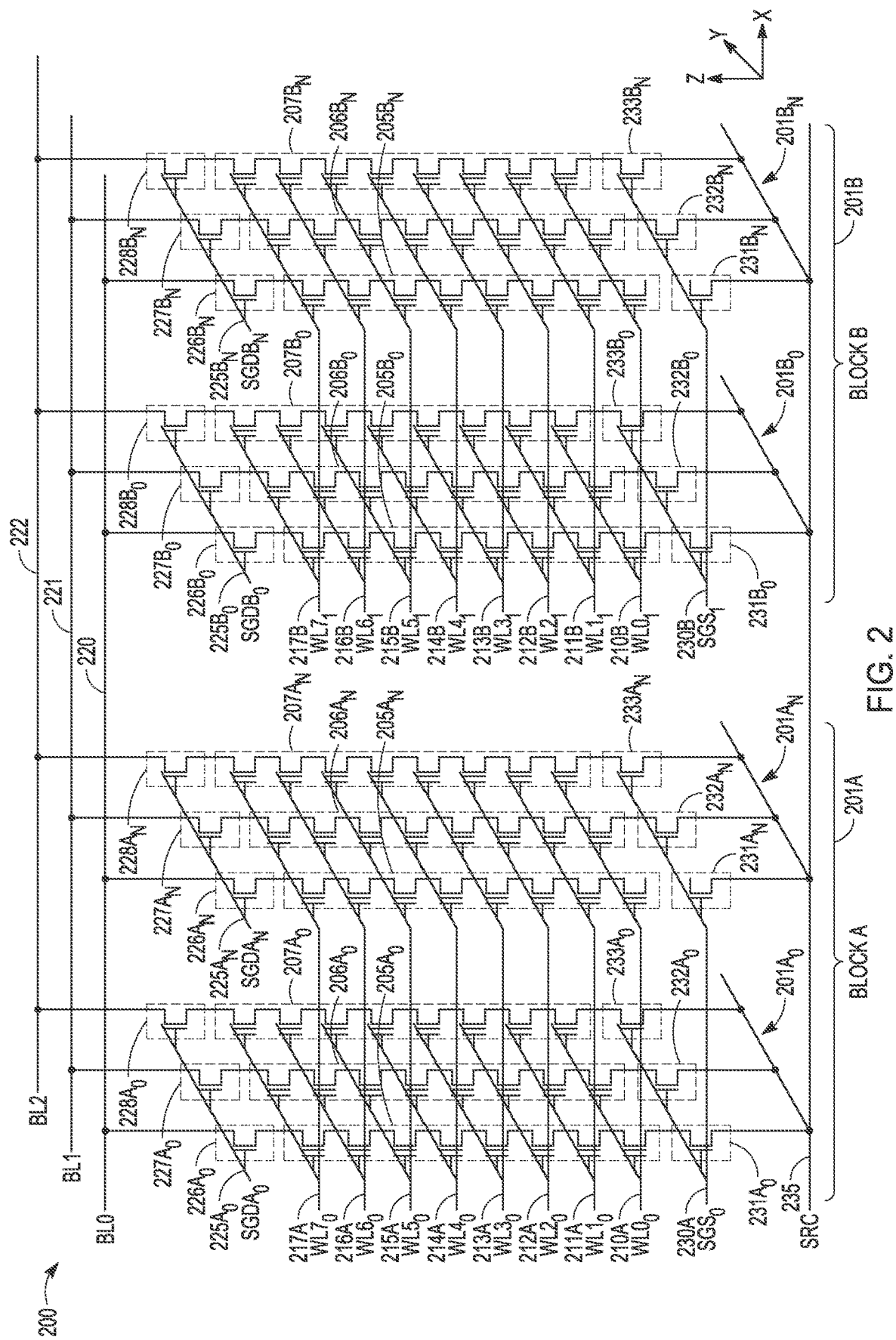
FIGS. 2 and 3 illustrate schematic diagrams of an example of a three-dimensional NAND architecture semiconductor memory array, according to various embodiments.

FIG. 2 illustrates an example schematic diagram of a 3D NAND architecture semiconductor memory array 200 that can be implemented as memory array 120 of FIG. 1. The 3D NAND architecture semiconductor memory array 200 can include a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, with each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array 200, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the CGs of each memory cell or select gate (or a portion of the CGs or select gates) of a respective tier of the array 200. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
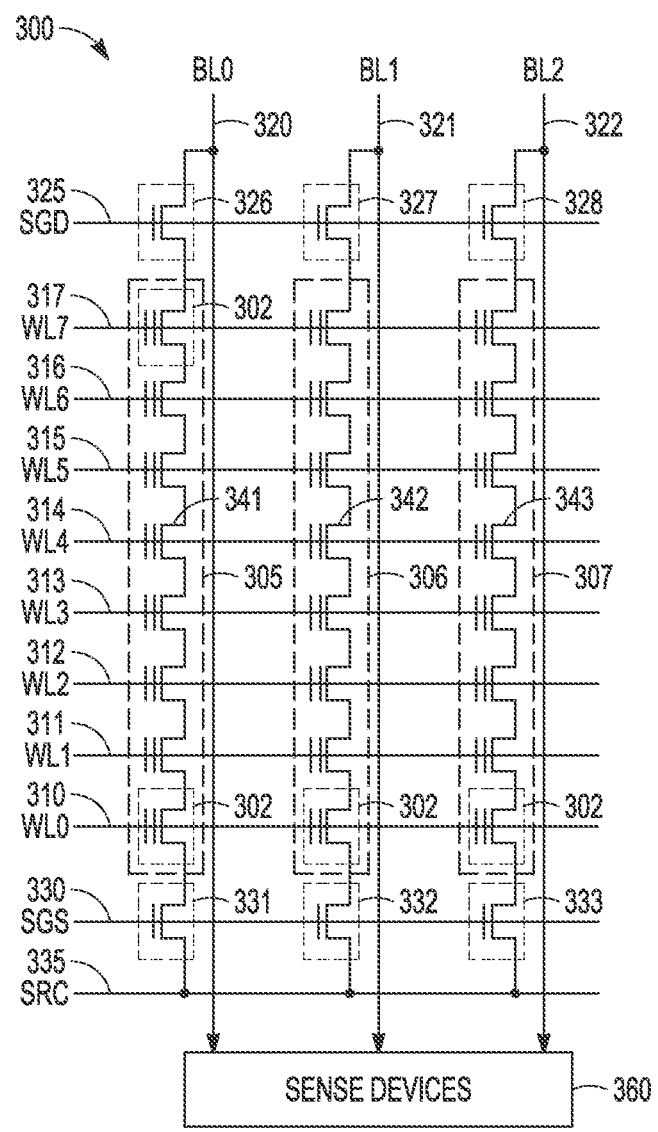

FIG. 3 illustrates an example schematic diagram of a portion of a NAND architecture semiconductor memory array 300 that can be implemented as memory array 120 of FIG. 1. The portion of the NAND architecture semiconductor memory array 300 can include a plurality of memory cells 302 arranged in a two-dimensional (2D) array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) 335 using a respective source-side select gate (SGS)

(e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third CGs 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or FN tunneling, etc.) from the channels to the floating gates or charge trap regions of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (e.g. Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage used to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or FN tunneling, etc.) from the floating gates of the targeted memory cells to the channels.

Figure 4:
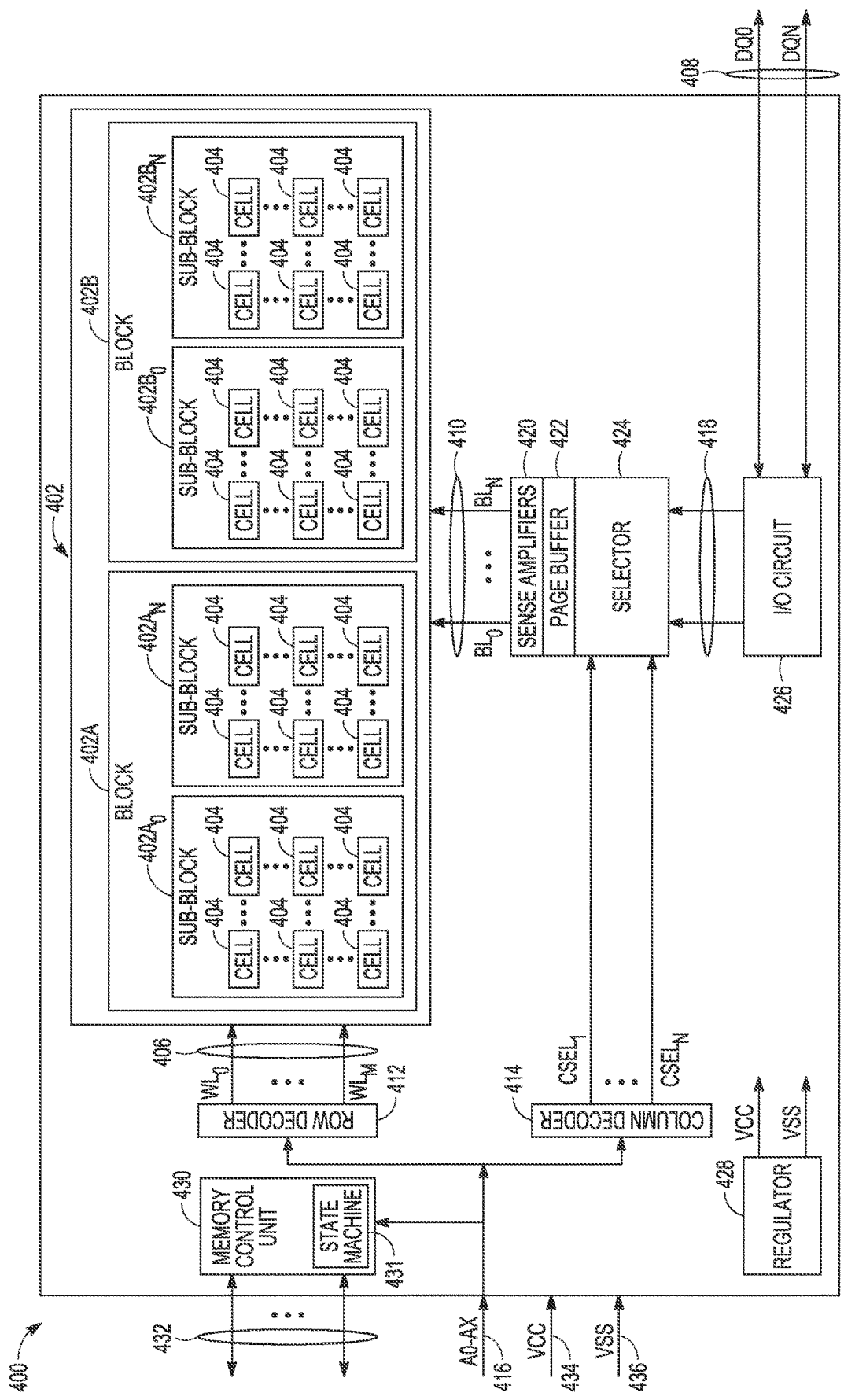
FIG. 4 illustrates an example block diagram of a memory module, according to various embodiments.

FIG. 4 illustrates an example block diagram of a memory device 400, which can be implemented in memory device 110 of FIG. 1, including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an I/O circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, with each page including a number of memory cells 404. Although illustrated herein as having two blocks, with each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432 or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The memory control unit 430 can include a state machine 431 coupled to the row decoder 412, the column decoder 414, and the I/O circuit 426. The state machine 413 can also output status data of the flash memory such as READY/BUSY or PASS/FAIL. In some designs, the state machine 413 can be configured to manage the programming process. The row decoder 412 and the column decoder 414 can receive and decode the address signals (A0-AX) from the address line 416, determine which of the memory cells 404 are to be accessed, and provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The I/O circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

In various embodiments, a row decoder of a memory device, such as the row decoder 412 of FIG. 4, can include HV switches configured to translate supply voltage of specific magnitudes to access lines (e.g., a global word line (GWL)) of memory cells. Output voltages from HV switches can be provided to the access lines to memory cells 404.

Figure 5:
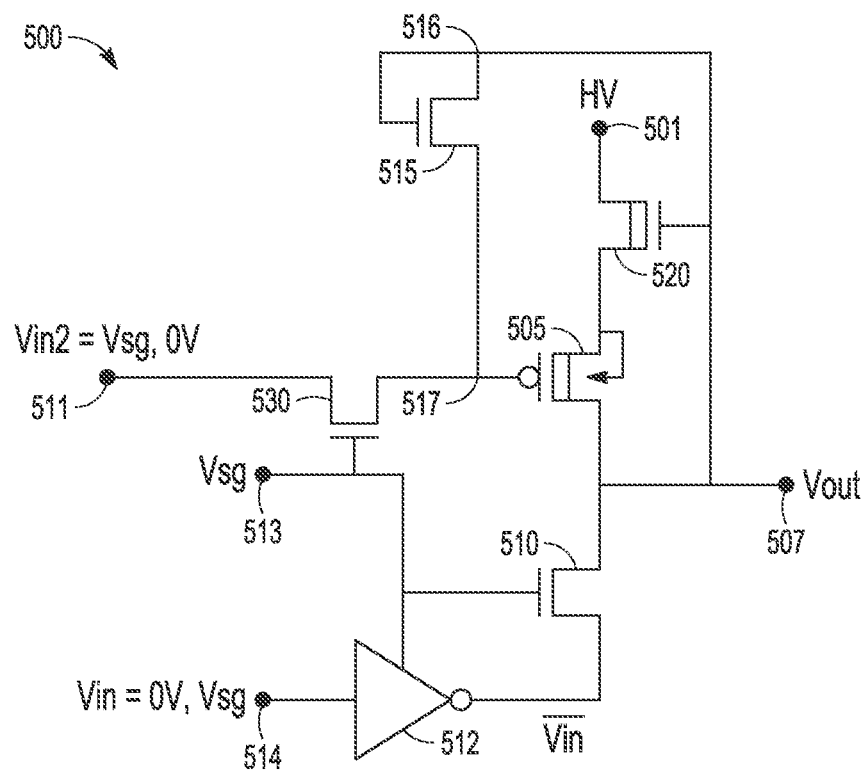
FIG. 5 illustrates an embodiment of an example of a high-voltage switch circuit having a diode structure coupled to an output node of the high-voltage switch to feedback an output voltage, according to various embodiments.

FIG. 5 illustrates a high-voltage switch circuit 500 having a diode structure 515 coupled to an output node 507 of the high-voltage switch 500 to feedback an output voltage. The high-voltage switch circuit 500 includes a first high-voltage transistor 505 coupled to the output node 507 and a second high-voltage transistor 510 coupled to the first high-voltage transistor 505 and to the output node 507. The first high-voltage transistor 505 has a gate separated from a channel structure by a dielectric region of the first high-voltage transistor 505 and the output node 507. The output node 507 is disposed and is coupled to transfer a voltage from the first high-voltage transistor 505 externally from the high-voltage switch circuit 500. The first high-voltage transistor 505 is coupled to receive a high voltage from a high-voltage node 501 for the high-voltage switch circuit 500. The second high-voltage transistor 510 is coupled to receive a version of an input signal Vin to the high-voltage switch circuit 500. The version of Vin can be provided to the second high-voltage transistor 510 as complement of Vin at the output of an inverter 512 having an input coupled to a node 514 to receive Vin. The diode structure 515 has a first node 516 coupled to the output node 507 with another terminal of the diode structure 515 coupled to a second node 517 that is coupled to a gate of the first high-voltage transistor 505. Feedback from the output node 507 to the gate of the first high-voltage transistor 505 through the diode structure 515 can prevent voltage across the dielectric region of the first high-voltage transistor 505 from entering a FN regime.

The first high-voltage transistor 505 can be structured as a HVP and the second high-voltage transistor 510 can be structured as a HVN. The diode structure 515 can be implemented by a FET in diode mode. The diode structure 515 can be wired in diode configuration. In various embodiments, the diode structure 515 can be structured using one or more FETs in diode mode.

The one or more FETs can be structured as a HV FET. Such a HV FET can be a HV n-type FET. The diode structure 515 can be structured as a high-Vt device. The diode structure 515 can be structured as a HVN having a high threshold voltage. For example, the Vt can be from about 3 V to about 4 V with a bulk voltage Vb of 0 V and the Vt can be from about 6 V to about 8 V with a bulk voltage Vb of −31 V, where the substrate of the diode structure 507 is biased negatively relative to the source. With the high-voltage switch circuit 500 having the first high-voltage transistor 505 structured as a HVP, a worst-case voltage across the dielectric region of HVP 505 can be approximately 8 V.

The high-voltage switch circuit 500 can include a transistor 520 that couples the HV node 501 to the first high-voltage transistor 505. The transistor 520 can be a HV depletion mode transistor having a n-channel structure with a negative threshold voltage. The transistor 520 has a gate coupled to the output node 507. The high-voltage switch circuit 500 can also include a transistor 530 coupled to the first high-voltage transistor 505 via the node 517 that is coupled to the diode structure 515. A drain of the transistor 530 can be coupled to an input node 511 to receive a second input signal Vin2. The second input signal Vin2 can be switched between zero volts and Vsg. An example of a voltage level of Vsg is 3.6 V. A gate of the transistor 530 can be coupled to a node 513 that can be coupled to a rail network. The rail network can be coupled to a node 513 to provide a fixed or constant voltage of Vsg to the gate of the transistor 530 and to a gate of the second high-voltage transistor 510, along with providing a bias to the inverter 512.

With the gate of the transistor 530 coupled to receive Vsg, when Vin2 is set to Vsg, the transistor 530 is operatively a second diode in the high-voltage switch circuit 500. The high-voltage switch circuit 500 relies on timing of Vin and Vin2 to avoid contention between the two diode structures, 515 and 530, pulling on the node 517 to the gate of the HVP gate node. Vin2 is taken to ground only momentarily when Vin switches to ground with the output of the inverter 512 switching to Vsg. Vin2 is switched back to Vsg before Vout reaches the Vt of the diode structure 515. Alternatively, a sense circuit can be used to detect either voltage on Vout being greater than Vsg plus the Vt of HVP 505 or an onset of current through the diode structure 515.

Figure 6:
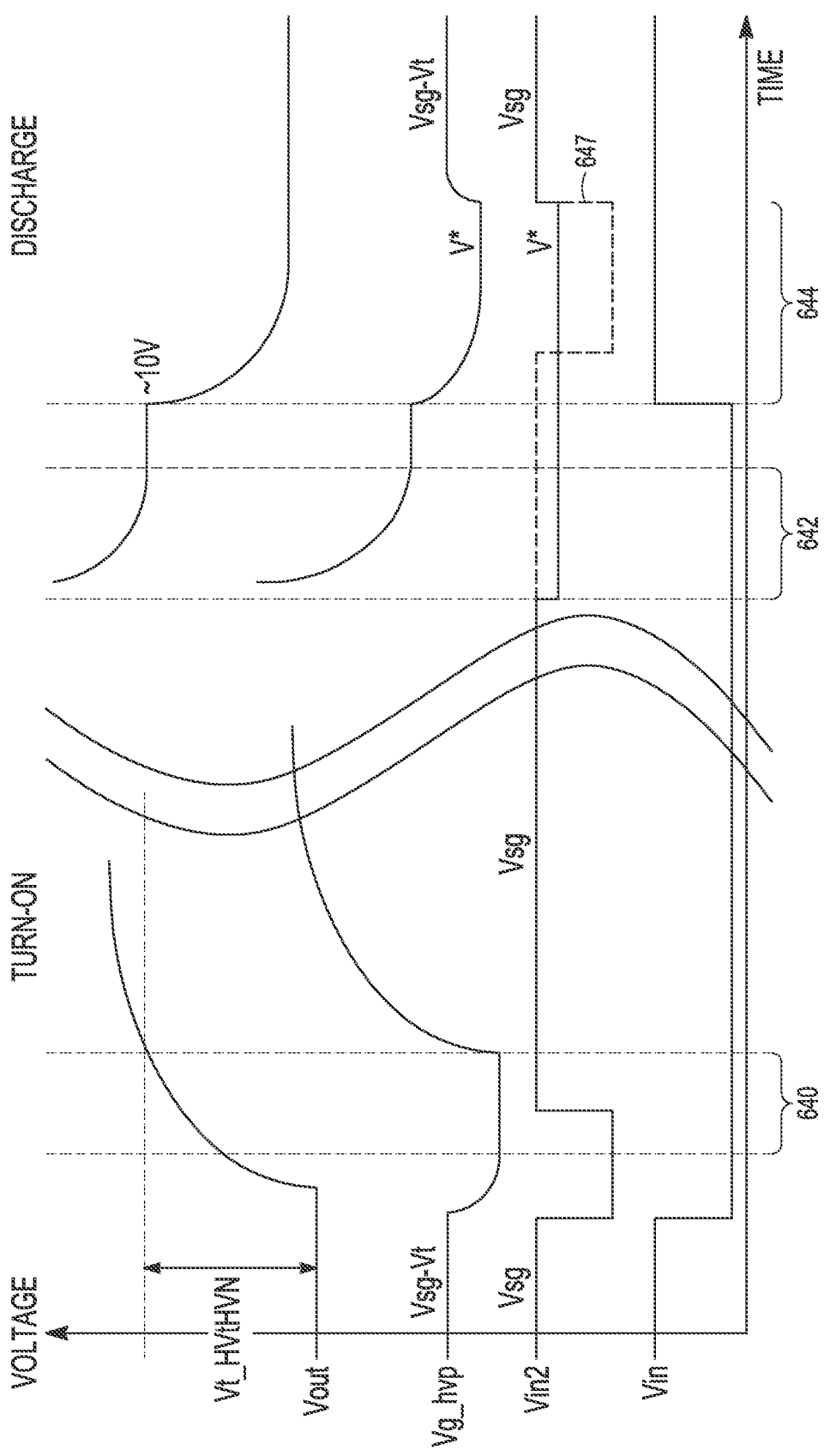
FIG. 6 illustrates example timing signals for the high-voltage switch circuit of FIG. 5, according to various embodiments.

FIG. 6 illustrates an embodiment of example timing signals for the high-voltage switch circuit 500 of FIG. 5. FIG. 6 shows voltage over time for a turn-on interval and voltage over time for a discharge interval. The voltage difference Vt_HVtHVN is the threshold voltage of the diode structure 515. Vg_hvp is the gate voltage on the gate of the first high-voltage transistor 505 and Vt is the threshold voltage of first high-voltage transistor 505. V* equals a bleeder voltage of Vg_hvp on the gate voltage on the gate of the first high-voltage transistor 505, which can be approximately equal to 2.8 V, but can be 0 V if not a reliability threat. To make Vsg-Vt as close to Vsg as possible, Vt can be minimized by structuring the transistor 530 to have a using low threshold voltage. Region 640 is a window for toggling Vin2 back to Vsg to avoid contention of transistor 530 and diode structure 515. This window occurs after Vout has risen to Vsg+Vt and before reaching Vt_HVtHVN. Region 642 is an interval in which the first high-voltage transistor 505 discharges through the node 501 for the HV. Region 644 is an interval in which the first high-voltage transistor 505 discharges through the second high-voltage transistor 510 and the node 514 for Vin. Alternative timing 647 can be used to wait until Vout is approximately Vt_HVTHVN, and then set Vin2 to 0 V to discharge the capacitive charge of the gate of the first high-voltage transistor 505 from node 517 out through Vin2 before resetting to Vsg.

Figure 7:
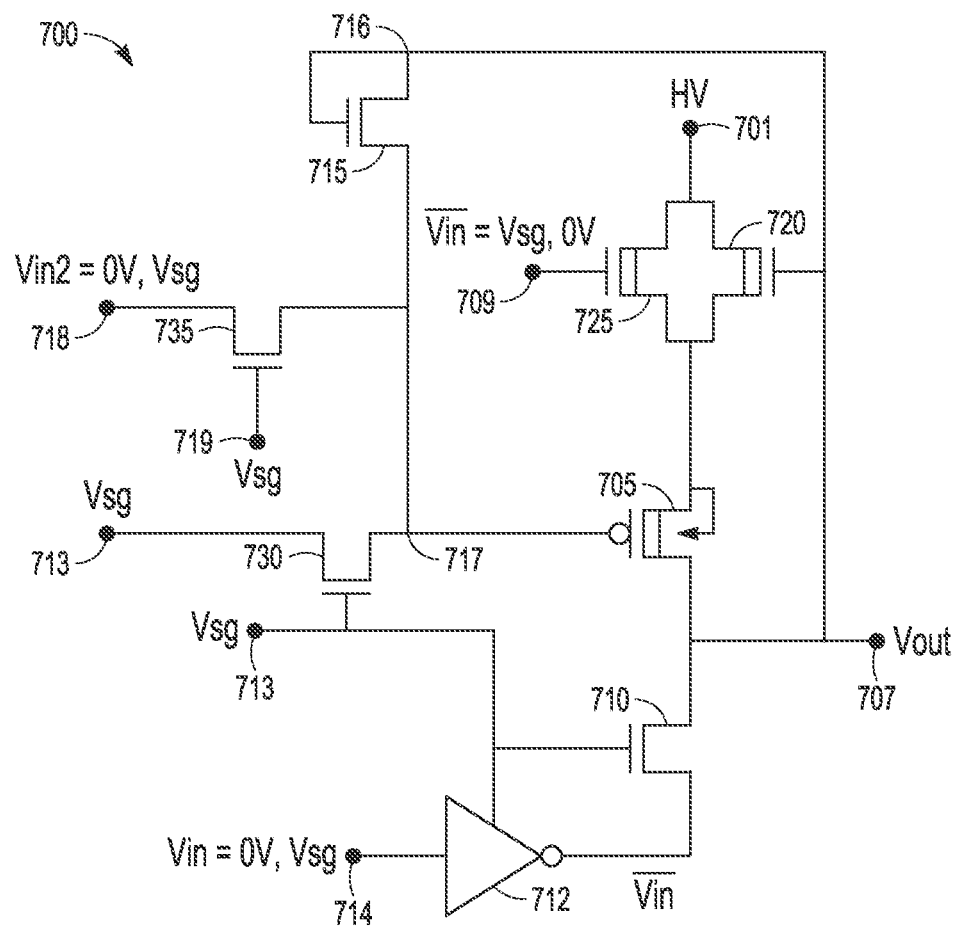
FIG. 7 illustrates an example of a high-voltage switch circuit having a high-voltage transistor coupled to an output node with the high-voltage transistor having a gate exposed to two diode structures, where one of the diode structures feeds back an output voltage, according to various embodiments.

FIG. 7 illustrates an embodiment of an example of a high-voltage switch circuit 700 having a first high-voltage transistor 705 coupled to an output node 707 with the first high-voltage transistor 705 having a gate exposed to two diode structures, where one of the diode structures feeds back an output voltage. The gate of the first high-voltage transistor 705 is separated from a channel structure by a dielectric region of the first high-voltage transistor 705. A diode structure 715 at node 716 is coupled to the output node 707 of the high-voltage switch 700 to feedback an output voltage Vout and is coupled to a node 717 coupled to the gate of the first high-voltage transistor 705. A diode structure 730 is coupled to the node 717 coupled to the gate of the first high-voltage transistor 705 and is coupled to a node 713 coupled to a fixed or constant voltage Vsg. Vsg can be provided by a rail network to which the high-voltage switch circuit 700 is coupled. The diode structure 715 can expose the node 717 to a voltage of Vout−HVt, where HVt is the threshold voltage of the diode structure 715. The diode structure 730 can expose the node 717 to a voltage of Vsg−Vt, where Vt is the threshold voltage of the diode structure 730. The gate of the first high-voltage transistor 705 coupled to node 717 will be pulled up to whichever voltage is greater. Feedback from the output node 707 to the gate of the first high-voltage transistor 705 through the diode structure 715 can be used to prevent voltage across the dielectric region of the first high-voltage transistor 705 from entering a FN regime.

The high-voltage switch circuit 700 includes a second high-voltage transistor 710 coupled to the first high-voltage transistor 705 and to the output node 707. The output node 707 is disposed and is coupled to transfer a voltage from the first high-voltage transistor 705 externally from the high-voltage switch circuit 700. The first high-voltage transistor 705 is coupled to receive a high voltage from a high-voltage node 701 for the high-voltage switch circuit 700. The second high-voltage transistor 710 is coupled to receive a version of an input signal Vin to the high-voltage switch circuit 700. The version of Vin can be provided to the second high-voltage transistor 710 as complement of Vin at the output of an inverter 712 having an input coupled to a node 714 to receive Vin. A gate of the second high-voltage transistor 710 is coupled to node 713 to receive Vsg, which is also provided as a bias to the inverter 712.

The first high-voltage transistor 705 can be structured as a HVP and the second high-voltage transistor 710 can be structured as a HVN. The diode structure 715 can be implemented by a FET in diode mode. The diode structure 715 can be wired in diode configuration. In various embodiments, the diode structure 715 can be structured using one or more FETs in diode mode. The one or more FETs can be structured as a HV FET. Such a HV FET can be a HV n-type FET. The diode structure 715 can be structured as a high-Vt device. The diode structure 715 can be structured as a HVN having a high threshold voltage HVt. The diode structure 730 can be implemented by a FET in diode mode. The diode structure 730 can be wired in diode configuration. In various embodiments, the diode structure 730 can be structured using one or more FETs in diode mode. The one or more FETs can be structured as a HV FET. Such a HV FET can be a HV n-type FET. The diode structure 730 can be structured as a HVN having a threshold voltage Vt. The threshold voltage Vt of the diode structure 730 can typically be less than HVt of the diode structure 715.

A transistor 720 couples the HV node 701 to the first high-voltage transistor 705 and has a gate coupled to the output node 707. The transistor 720 can be a HV depletion mode transistor having a n-channel structure with a negative threshold voltage. The transistor 720 has a gate coupled to the output node 707. A transistor 725 is coupled in parallel with the transistor 720, also coupling the HV node 701 to the first high-voltage transistor 705. A gate of the transistor 725 is coupled to node 709 to receive the complement of Vin. The transistor 725 can be a HV depletion mode transistor having a n-channel structure with a negative threshold voltage. The transistor 725 can be considered a helper device. Because voltage on the gate of the first high-voltage transistor 705 does not goes to ground, the transistor 725 can be used to assist triggering turn-on.

The discharge of the capacitance of the gate of the first high-voltage transistor 705 through a transistor 735 at node 718 can be used to pull the voltage on the node 717 coupled to the gate of the first high-voltage transistor back down to Vsg and ensure that node 717 remains at about Vout-HVt. The transistor 735, having a gate coupled to Vsg at node 719, can be a weak device relative to other transistors in the high-voltage switch circuit 700 such that the diode structure 715 is barely forward biased. A weak transistor is structured with a high resistance through its channel structure, which can be attained with a small W/L ratio. The transistor 735 uses its own timing on Vin2 so it does not attempt to pull down the node 717 below Vsg.

Figure 8:
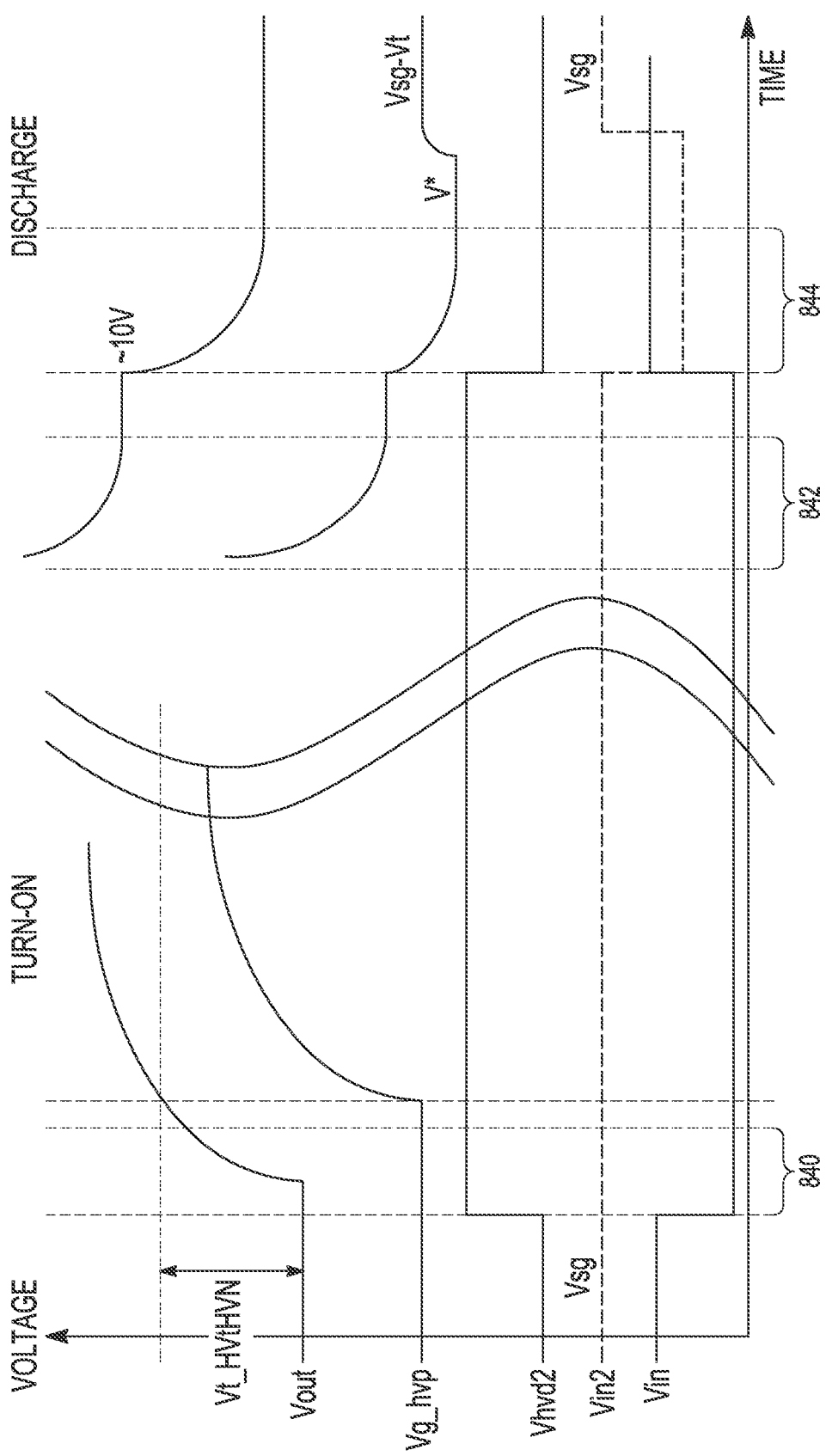
FIG. 8 illustrates example timing signals for the high-voltage switch circuit of FIG. 7, according to various embodiments.

FIG. 8 illustrates an embodiment of example timing signals for the high-voltage switch circuit 700 of FIG. 7. FIG. 8 shows voltage over time for a turn-on interval and voltage over time for a discharge interval. The voltage difference Vt_HVtHVN is the threshold voltage of the diode structure 715. Vg_hvp is the gate voltage on the gate of the first high-voltage transistor 705 and Vt is the threshold voltage of first high-voltage transistor 705. V* is defined by contention between the two diode structures 715 and 730 coupled to node 717 coupled to the gate of the first high-voltage transistor 705. To make Vsg−Vt as close to Vsg as possible, Vt can be minimized by forming the diode structure 730 as a low threshold device. Region 840 is an interval in which the helper transistor 725 kickstarts feedback from output node 701 to the diode structure 715. Region 842 is an interval in which the first high-voltage transistor 505 discharges through the node 501 for the HV. Region 844 is an interval in which the first high-voltage transistor 705 discharges through the second high-voltage transistor 710 and the node 714 for Vin.

Figure 9:
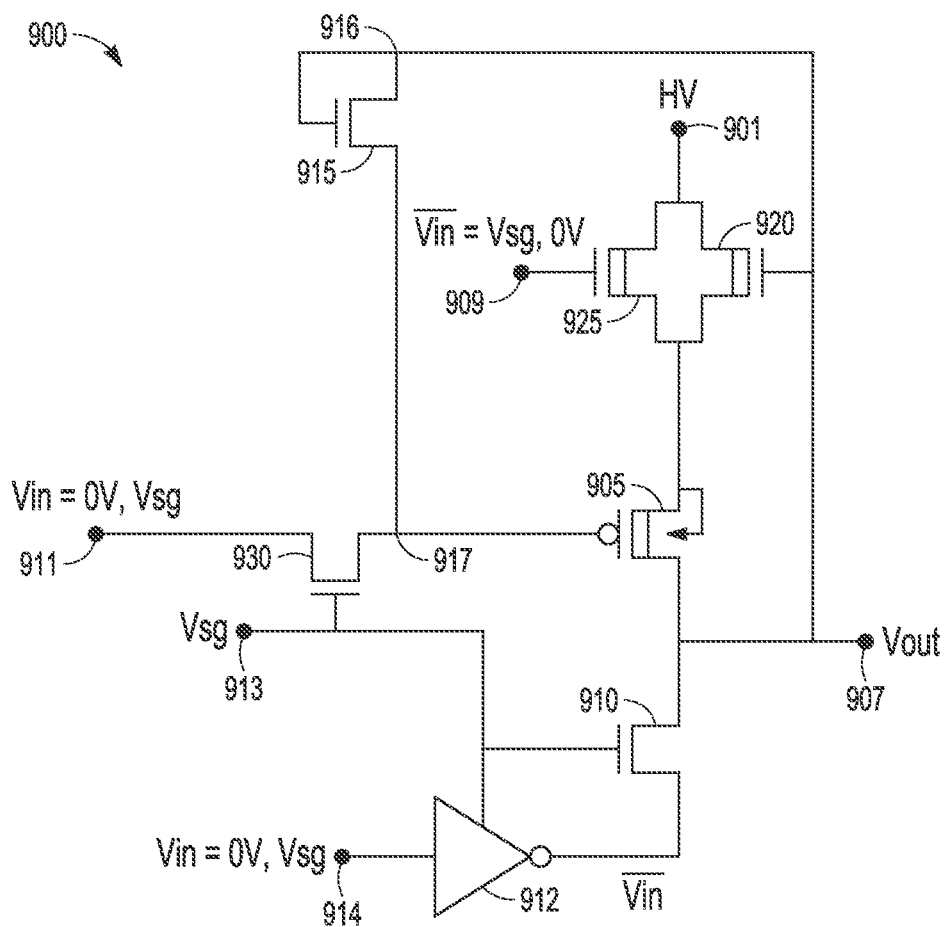
FIG. 9 illustrates an example of a high-voltage switch circuit having a diode structure coupled to an output node of the high-voltage switch to feedback an output voltage, according to various embodiments.

FIG. 9 illustrates an embodiment of an example of a high-voltage switch circuit 900 having a diode structure 915 coupled to an output node 907 of the high-voltage switch 900 to feedback an output voltage Vout. The high-voltage switch circuit 900 includes a first high-voltage transistor 905 coupled to the output node 907 and a second high-voltage transistor 910 coupled to the first high-voltage transistor 905 and to the output node 907. The first high-voltage transistor 905 has a gate separated from a channel structure by a dielectric region of the first high-voltage transistor 905. The output node 907 is disposed and is coupled to transfer a voltage from the first high-voltage transistor 905 externally from the high-voltage switch circuit 900. The first high-voltage transistor 905 is coupled to receive a high voltage from a high-voltage node 901 for the high-voltage switch circuit 900. The second high-voltage transistor 910 is coupled to receive a version of an input signal Vin to the high-voltage switch circuit 900. The version of Vin can be provided to the second high-voltage transistor 910 as complement of Vin at the output of an inverter 912 having an input coupled to a node 914 to receive Vin. The diode structure 915 has a first node 916 coupled to the output node 907 with another terminal of the diode structure 915 coupled to a second node 917 that is coupled to a gate of the first high-voltage transistor 905. Feedback from the output node 907 to the gate of the first high-voltage transistor 905 through the diode structure 915 can prevent voltage across the dielectric region of the first high-voltage transistor 905 from entering a FN regime.

The first high-voltage transistor 905 can be structured as a HVP and the second high-voltage transistor 910 can be structured as a HVN. The diode structure 915 can be implemented by a FET in diode mode. The diode structure 915 can be wired in diode configuration. In various embodiments, the diode structure 915 can be structured using one or more FETs in diode mode. The one or more FETs can be structured as a HV FET. Such a HV FET can be a HV n-type FET. The diode structure 915 can be structured as a high-Vt device. The diode structure 915 can be structured as a HVN having a high threshold voltage.

A transistor 920 couples the HV node 901 to the first high-voltage transistor 905 and has a gate coupled to the output node 907. The transistor 920 can be a HV depletion mode transistor having a n-channel structure with a negative threshold voltage. A transistor 925 is coupled in parallel with the transistor 920, also coupling the HV node 901 to the first high-voltage transistor 905. A gate of the transistor 925 is coupled to node 909 to receive the complement of Vin. The transistor 925 can be a HV depletion mode transistor having a n-channel structure with a negative threshold voltage. The transistor 925 can be considered a helper device. Because voltage on the gate of the first high-voltage transistor 905 does not goes to ground, the transistor 925 can be used to assist triggering turn-on.

The high-voltage switch circuit 900 can also include a transistor 930 coupled to the first high-voltage transistor 905 via the node 917 that is coupled to the diode structure 915. A drain of the transistor 930 can be coupled to an input node 911 to receive the input signal Vin. The input signal Vin can be switched between zero volts and Vsg. An example of a voltage level of Vsg is 3.6 V. A gate of the transistor 930 can be coupled to a node 913 that can be coupled to a rail network. The rail network can be coupled to a node 913 to provide a fixed or constant voltage of Vsg to the gate of the transistor 930 and to a gate of the second high-voltage transistor 910, along with providing a bias to the inverter 912.

The transistor 930 configured to bias the first high-voltage transistor 905 can also work to discharge the first high-voltage transistor 905. Vin can separately be applied to transistor 930 and to the inverter 912 or Vin can be applied with node 911 for the transistor 930 wired to the node 914 to the inverter 912. The transistor 930 can be structured as a weak device because it is desired for the discharge current drawn from the transistor 930 to be a modest amount, keeping the diode structure 915 barely forward biased. The high-voltage switch circuit 900 can be structured without the helper transistor 925 when the transistor 930 is a sufficiently weak device to not put the diode structure 915 in significant contention, but sufficiently strong to charge and discharge the capacitance at the node 917 coupled to the gate of the first high-voltage transistor 905.

When Vin is toggled to ground, the voltage on the gate of the first high-voltage transistor 905 is pulled to ground through the transistor 930, and Vout begins to rise until it reaches the turn-on point of the diode structure 915, at which point there is contention between the diode structure 915 and the transistor 930, which can be addressed with the transistor 930 being a weak device. Some current will bleed from the output node 907 through the diode structure 915 and the transistor 930 and should be low enough not to be a significant load on a pump for the HV supplied at node 901. This bleed current will keep the voltage on the gate of the first high-voltage transistor 905 at Vout−Vt_HVTHVN during turn-on and discharge until Vin toggles back to Vsg, where Vt_HVTHVN is the threshold voltage of the diode structure 915, At this point, the voltage on the gate of the first high-voltage transistor 905 can be approximately 10 V−4 V=6 V, in an example with Vsg=3.6 V. There can be some trapped charge on the a portion of the first high-voltage transistor 905 associated with its gate, but this is not a significant amount and occurs with the conventional designs of HV switches using a transistor such as the first high-voltage transistor 905.

Figure 10:
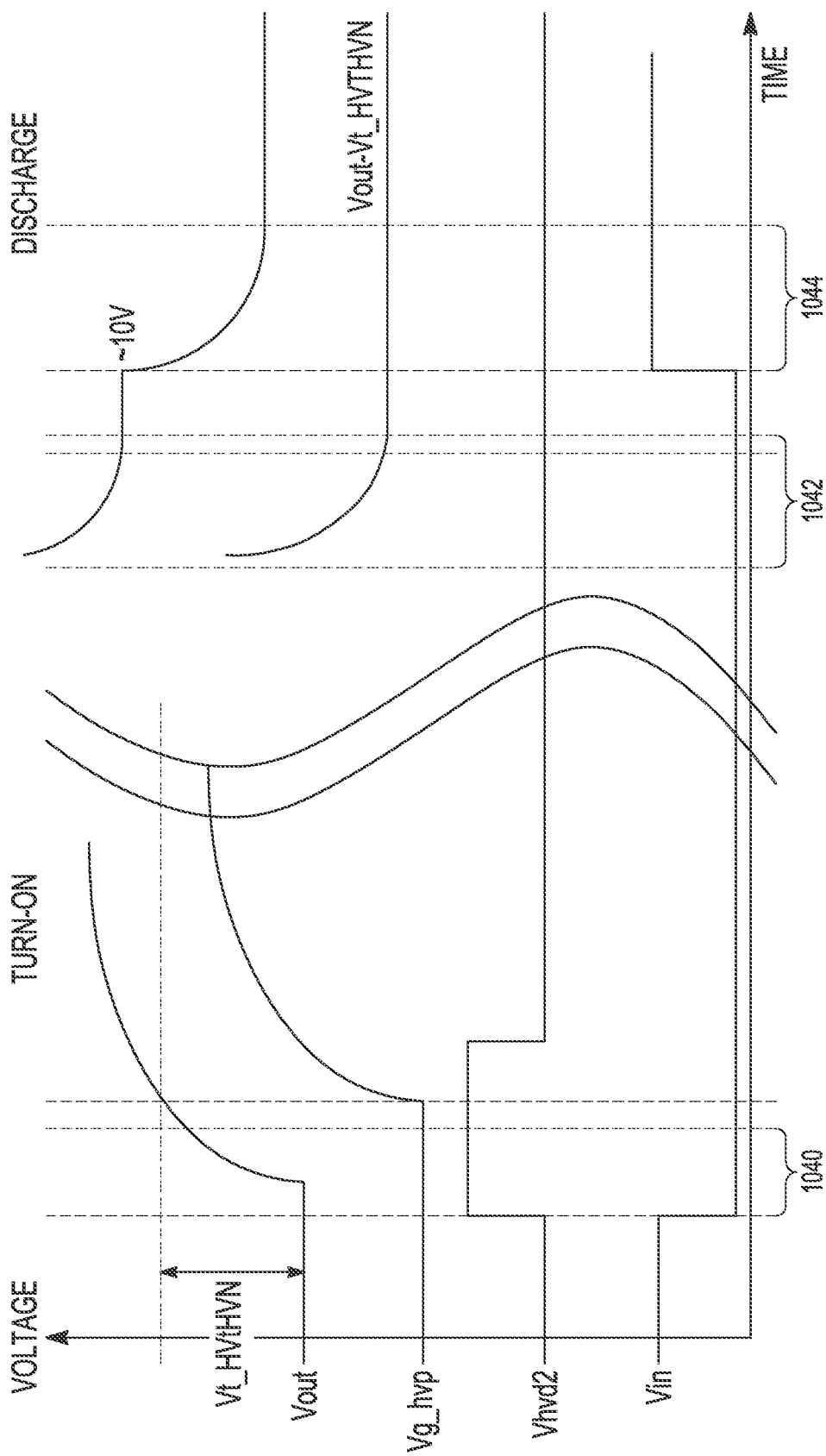
FIG. 10 illustrates example timing signals for the high-voltage switch circuit of FIG. 9, according to various embodiments.

FIG. 10 illustrates an embodiment of example timing signals for the high-voltage switch circuit 900 of FIG. 9. FIG. 10 shows voltage over time for a turn-on interval and voltage over time for a discharge interval. The voltage difference Vt_HVtHVN is the threshold voltage of the diode structure 915. Vg_hvp is the gate voltage on the gate of the first high-voltage transistor 905. Vhvd2 is the voltage across the transistor 925. Region 1040 is a time interval in which the helper transistor 925 kickstarts the feedback process to the diode structure 915. Region 1042 is a time interval in which the first high-voltage transistor 905 discharges through the node 901 for the HV. Region 1044 is a time interval in which the first high-voltage transistor 505 discharges through the second high-voltage transistor 910 and the node 914 for Vin.

Figure 11:
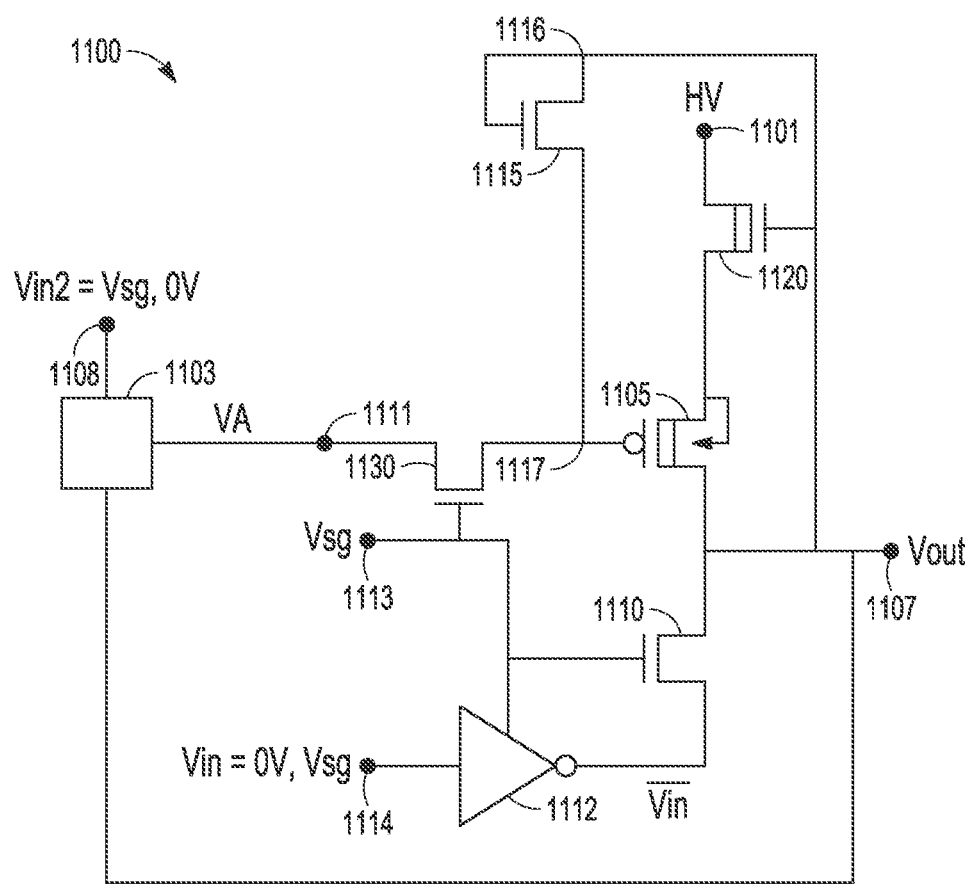
FIG. 11 illustrates an example sense circuit operable with a high-voltage switch circuit, according to various embodiments.

FIG. 11 illustrates an embodiment of an example sense circuit 1103 operable with a high-voltage switch circuit 1100. The high-voltage switch circuit 1100 has a diode structure 1115 coupled to an output node 1107 of the high-voltage switch 1100 to feedback an output voltage. The output node 1107 is coupled back to the sense circuit 1103. The high-voltage switch circuit 1100 includes a first high-voltage transistor 1105 coupled to the output node 1107 and a second high-voltage transistor 1110 coupled to the first high-voltage transistor 1105 and to the output node 1107.

The first high-voltage transistor 1105 has a gate separated from a channel structure by a dielectric region of the first high-voltage transistor 1105 and the output 1107. The output node 1107 is disposed and is coupled to transfer a voltage from the first high-voltage transistor 1105 externally from the high-voltage switch circuit 1100. The first high-voltage transistor 1105 is coupled to receive a high voltage from a high-voltage node 1101 for the high-voltage switch circuit 1100. The second high-voltage transistor 1110 is coupled to receive a version of an input signal Vin to the high-voltage switch circuit 1100. The version of Vin can be provided to the second high-voltage transistor 1110 as complement of Vin at the output of an inverter 1112 having an input coupled to a node 1114 to receive Vin. The diode structure 1115 has a first node 1116 coupled to the output node 1107 with another terminal of the diode structure 1115 coupled to a second node 1117 that is coupled to a gate of the first high-voltage transistor 1105. Feedback from the output node 1107 to the gate of the first high-voltage transistor 1105 through the diode structure 1115 can prevent voltage across the dielectric region of the first high-voltage transistor 1105 from entering a FN regime.

The first high-voltage transistor 1105 can be structured as a HVP and the second high-voltage transistor 1110 can be structured as a HVN. The diode structure 1115 can be implemented by a FET in diode mode. The diode structure 1115 can be wired in diode configuration. In various embodiments, the diode structure 1115 can be structured using one or more FETs in diode mode. The one or more FETs can be structured as a HV FET. Such a HV FET can be a HV n-type FET. The diode structure 1115 can be structured as a high-Vt device. The diode structure 1115 can be structured as a HVN having a high threshold voltage.

The high-voltage switch circuit 1100 can include a transistor 1120 that couples the HV node 1101 to the first high-voltage transistor 1105. The transistor 1120 can be a HV depletion mode transistor having a n-channel structure with a negative threshold voltage. The transistor 1120 has a gate coupled to the output node 1107. The high-voltage switch circuit 1100 can also include a transistor 1130 coupled to the first high-voltage transistor 1105 via the node 1117 that is coupled to the diode structure 1115. A drain of the transistor 1130 can be coupled to an input node 1111 to receive signal VA from the sense circuit 1103. The sense circuit 1103 can be coupled to a node 1108 to receive a second input signal Vin2 that can be switched between zero volts and Vsg and supplied as VA. An example of a voltage level of Vsg is 3.6 V. A gate of the transistor 1130 can be coupled to a node 1113 that can be coupled to a rail network. The rail network can be coupled to a node 1113 to provide a fixed or constant voltage of Vsg to the gate of the transistor 1130 and to a gate of the second high-voltage transistor 1110, along with providing a bias to the inverter 1112.

The sense circuit 1103 can be used to detect either voltage Vout on output node 1107 being greater than a fixed or constant voltage Vsg plus the threshold voltage of the first high-voltage transistor 1105 or onset of current through the diode structure 1115. A voltage Vdelta can define a margin for a trigger to toggle VA to Vsg from 0 V. A critical threshold voltage VtCrit can be defined relative to the threshold voltage Vt_HVtHVN of the diode structure 1115 and Vdelta as VtCrit equal to Vt_HVtHVN−Vdelta. Logic of the sense circuit 1103 can be structured relative to Vsg and VtCrit. With Vin2 equal to Vsg, VA equals Vsg regardless of Vout. With Vin2 equal to 0 V, Vout can be less than VtCrit with VA equal to 0 V. With Vin2 equal to 0 V, Vout can be greater than VtCrit with VA equal to 0 V. Vin2 can be toggled back to Vsg from 0 V safely any time after the sense circuit 1103 has been triggered without risk of contention with the diode structure 1115.

A sensing circuit such as the sense circuit 1103 can be implemented in HV switch circuit 500 of FIG. 5, HV switch circuit 700 of FIG. 7, HV circuit 900 of FIG. 9, HV switch circuit 1100 of FIG. 11, or other similar HV circuit with appropriate modifications. These sensing circuits for a HV switch circuit provide a mechanism to prevent voltage across a dielectric region of the HV switch circuit's HV translating transistor from entering a Fowler-Nordheim regime, with the sensing circuit arranged to detect either voltage on the output node coupled to the HV switch circuit's HV translating transistor or an onset of current through a feedback diode structure of the HV switch circuit.

Various high-voltage switch circuits, as taught herein such as high-voltage switch circuit 500 of FIG. 5, high-voltage switch circuit 700 of FIG. 7, high-voltage switch circuit 900 of FIG. 9, and high-voltage switch circuit 1100 of FIG. 11, can include a control circuitry to control timing of input signals to prevent voltage across a dielectric region of their HV transistors coupled to provide HV to an output node from entering a Fowler-Nordheim regime. With such a high-voltage switch circuit implemented in a memory device, the high-voltage switch circuit can be implemented in a row decoder circuit for a memory array of the memory device. For example, the high-voltage switch circuit can be part of the row decoder 412 control circuitry of memory device 400 of FIG. 4. Timing signals can be provided by logic circuitry, such as a state machine of the memory device implementing a HV switch circuit as taught herein. High voltages can be provided by on-board charge pumps of the memory as are some of intermediate voltages used throughout the memory. The Vsg voltage used in various embodiments can either be provided by external power source via a dedicated pin of the memory device or can be pumped up from the Vcc supply voltage, depending on the specification sheet of the given particular memory die. For example, if Vcc is 1.8V and Vsg is to be 3.6 V, then Vsg is pumped up from the 1.8 V.

Embodiments of a HV switch circuit, as taught herein, can be structured in the memory die for which the HV switch circuit is implemented. Logic, HV switch circuits, and analog circuitry can be structured on the memory die under the memory array of the device. The circuitry under the memory array can be implemented as part of complementary metal oxide semiconductor (CMOS) circuitry of the memory die. Alternatively, the HV switch circuit can be built with CMOS circuits on a separate die with the separate die bonded to a memory array die for the memory device. Devices shown in the HV circuits discussed herein show particular carrier-type transistors. Alternatively, opposite type FETS or other transistors can be used with appropriate modifications to implement a feedback mechanism provided by using a feedback diode structure.

Figure 12:
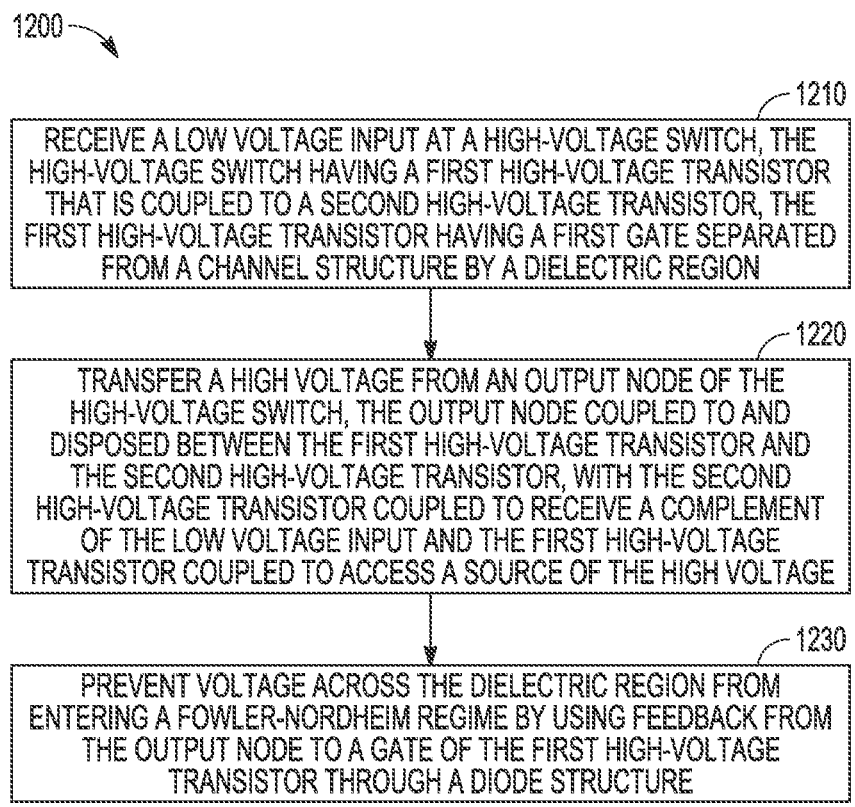
FIG. 12 is a flow diagram of features of an example method of controlling a high-voltage switch, according to various embodiments.

FIG. 12 is a flow diagram of features of an embodiment of an example method 1200 of controlling a high-voltage switch. At 1210, a low voltage input is received at the high-voltage switch. The high-voltage switch has a first high-voltage transistor that is coupled to a second high-voltage transistor, where the first high-voltage transistor has a first gate separated from a channel structure by a dielectric region. At 1220, a high voltage is transferred from an output node of the high-voltage switch. The output node is coupled to and disposed between the first high-voltage transistor and the second high-voltage transistor. The second high-voltage transistor is coupled to receive a complement of the low voltage input and the first high-voltage transistor is coupled to access a source of the high voltage. At 1230, voltage across the dielectric region is prevented from entering a Fowler-Nordheim regime by using feedback from the output node to a gate of the first high-voltage transistor through a diode structure.

Variations of the method 1200 or methods similar to the method 1200 can include a number of different embodiments that may be combined depending on the application of such methods and/or the architecture of memory devices in which such methods are implemented. Such variations can include, with a third high-voltage transistor coupled to the gate of the first high-voltage transistor, taking an input voltage coupled to the third high-voltage transistor to ground for a period when the low voltage input switches to ground and switching the input voltage to the third high-voltage transistor back to a low bias voltage before voltage at the output node reaches a threshold voltage of the diode structure.

Variations of the method 1200 or methods similar to the method 1200 can include starting the feedback by applying the complement of the low voltage input to a first gate of a first high-voltage depletion transistor arranged in parallel to a second high-voltage depletion transistor. The first and second high-voltage depletion transistors are coupled to the first high-voltage transistor and coupled to the source of the high-voltage, with the second high-voltage depletion transistor having a second gate coupled to the output node.

Variations of the method 1200 or methods similar to the method 1200 can include discharging gate capacitance of the first high-voltage transistor through a node coupled to the source of the high voltage. The gate capacitance can be further discharged through a biasing high-voltage transistor coupled to the gate of the first high-voltage transistor, after discharging gate capacitance through the node coupled to the source of the high voltage.

In various embodiments, a high-voltage switch circuit comprises a first high-voltage transistor having a first gate separated from a channel structure by a dielectric region, where the first high-voltage transistor is coupled to receive a high voltage from a high-voltage node of the high-voltage switch circuit. A second high-voltage transistor is coupled to the first high-voltage transistor, where the second high-voltage transistor is coupled to receive a version of an input signal to the high-voltage switch circuit. An output node is disposed between and coupled to the first high-voltage transistor and the second high-voltage transistor, with the output node coupled to transfer a voltage from the first high-voltage transistor externally from the high-voltage switch circuit. A diode structure has a first node coupled to the output node and a second node coupled to the first gate. The diode structure can include one or more FETs in diode mode.

Variations of such a high-voltage switch circuit or similar high-voltage switch circuits can include a number of different embodiments that may be combined depending on the application of such high-voltage switch circuits and/or the architecture in which such high-voltage switch circuits are implemented. Such high-voltage switch circuits can include a third high-voltage transistor coupling the first high-voltage transistor to the high-voltage node, the third high-voltage transistor having a second gate coupled to the output node.

Variations of such a high-voltage switch circuit or similar high-voltage switch circuits can include the first high-voltage transistor being coupled to a rail network to allow initial grounding of the first gate during initiation of the high-voltage switch circuit to an on-status. The high-voltage switch circuit can include a second diode structure to couple to the rail network. The high-voltage switch circuit can also include a third high-voltage transistor and a fourth high-voltage transistor arranged in parallel to each other, with the third high-voltage transistor and the fourth high-voltage coupling the first high-voltage transistor to the high-voltage node, where the third high-voltage transistor has a second gate coupled to the output node.

Variations of such a high-voltage switch circuit or similar high-voltage switch circuits can include the first high-voltage transistor being coupled to a rail network to allow initial grounding of the first gate during initiation of the high-voltage switch circuit to an on-status, with a fifth high-voltage transistor having a gate coupled to receive a rail voltage and an input switchable between the rail voltage and 0V, where the fifth high-voltage transistor is coupled to the first transistor.

Variations of such a high-voltage switch circuit or similar high-voltage switch circuits can include control circuitry to control timing of the input signal and a second input signal to prevent voltage across the dielectric region from entering a Fowler-Nordheim regime. Variations can include a sensing circuit to prevent voltage across the dielectric region from entering a Fowler-Nordheim regime, with the sensing circuit arranged to detect either voltage on the output node or an onset of current through the diode structure and to generate a second input signal to a fifth high-voltage transistor coupled to the first high-voltage transistor.

In various embodiments, a memory device can comprise a group of memory cells; and a high-voltage switch circuit to provide a voltage to one or more access lines coupled to the group of memory cells. The high-voltage switch circuit can include: a p-channel FET, the p-channel FET having a first gate separated from a channel structure by a dielectric region, the p-channel FET being a high-voltage transistor coupled to a high-voltage node of the high-voltage switch circuit; a n-channel FET coupled to the p-channel FET, the n-channel FET being a high-voltage transistor coupled to receive a complement of an input signal to the high-voltage switch circuit; an output node coupled to the p-channel FET and the n-channel FET, the output node disposed between the p-channel FET and the n-channel FET, with the output node coupled to transfer the voltage from the p-channel FET directed to the one or more access lines; and a diode structure having a first node coupled to the output node and a second node coupled to the first gate; and control circuitry to control timing of signals to the high-voltage switch circuit to prevent voltage across the dielectric region from entering a Fowler-Nordheim regime. The diode structure can include one or more n-channel FETs in diode mode.

Variations of such a memory device or similar memory devices can include a number of different embodiments that may be combined depending on the application of such memory devices and/or the architecture in which such memory devices are implemented. Such memory devices can include the high-voltage switch circuit having a high-voltage depletion n-channel FET coupled to the p-channel FET and to the high-voltage node, with the high-voltage depletion n-channel FET having a second gate coupled to the output node.

Variations of such a memory device or similar memory devices can include the high-voltage switch circuit having a second diode structure coupled to receive a fixed input signal and coupled to the first gate and having a first high-voltage depletion n-channel field effect and a second high-voltage depletion n-channel field effect arranged in parallel to each other with the first and second high-voltage depletion n-channel field effects coupled to the p-channel FET and coupled to the high-voltage node. The first high-voltage depletion n-channel field effect can have a second gate coupled to the output node and the second high-voltage depletion n-channel field effect can have a second gate coupled to receive the complement of the input signal. The high-voltage switch circuit can include a second high-voltage n-channel FET coupled to the diode structure and to the first gate. The second high-voltage n-channel FET can have a gate coupled to receive the fixed input signal and can have a drain coupled to receive one of the input signals controlled by the control circuitry.

Variations of such a memory device or similar memory devices can include the high-voltage switch circuit having a second high-voltage n-channel FET coupled to the first gate, where the second high-voltage n-channel FET has a gate coupled to a fixed input signal and has a drain coupled to receive the input signal. The high-voltage switch circuit can also have a first high-voltage depletion n-channel field effect and a second high-voltage depletion n-channel field effect arranged in parallel to each other with the first and second high-voltage depletion n-channel field effects coupled to the p-channel FET and coupled to the high-voltage node. The first high-voltage depletion n-channel field effect can have a second gate coupled to the output node and the second high-voltage depletion n-channel field effect can have a second gate coupled to receive the complement of the input signal. The input signal can change between a voltage of the fixed input signal or zero volts.

Figure 13:
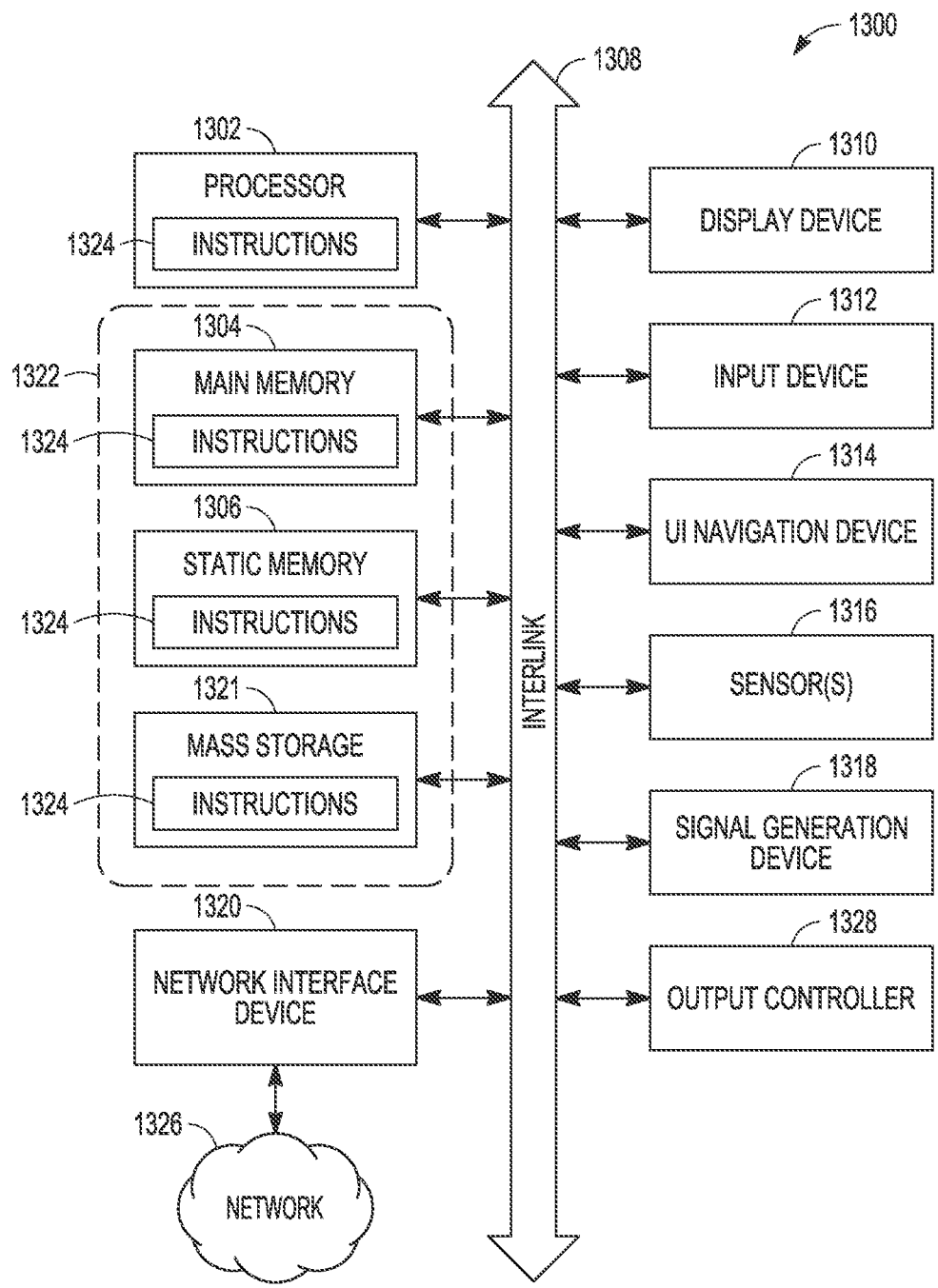
FIG. 13 is a block diagram illustrating an example of a machine upon which one or more embodiments may be implemented, according to various embodiments.

FIG. 13 is a block diagram of an embodiment of an example machine 1300 upon which any one or more of the techniques (e.g., methodologies) discussed herein may perform. In alternative embodiments, the machine 1300 may operate as a standalone device or may be connected (e.g., networked) to other machines. In a networked deployment, the machine 1300 may operate in the capacity of a server machine, a client machine, or both in server-client network environments. In an example, the machine 1300 may act as a peer machine in peer-to-peer (P2P) (or other distributed) network environment. The machine 1300 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies, such as cloud computing, software as a service (SaaS), other computer cluster configurations. The example machine 1300 can be arranged to operate in the environment 100 of FIG. 1. The example machine 1300 can include one or more memory devices having structures including one or more HV switch circuits as discussed herein and with respect to the memory array 200 of FIG. 2, the memory array 300 of FIG. 3, and the memory device 400 of FIG. 4.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1300, such as but not limited to a computer system or a system including for example the host device 105, the memory device 110, etc. of FIG. 1, can include a processor 1302, which can be a hardware processor such as, for example, a CPU, a GPU, a hardware processor core, or any combination thereof, such as the memory processing device 115, etc. The machine 1300 can include a main memory 1304 and a static memory 1306, some or all of which may communicate with each other via an interlink (e.g., bus) 1308. The machine 1300 can further include a display device 1310, an alphanumeric input device 1312 (e.g., a keyboard), and a user interface (UI) navigation device 1314 (e.g., a mouse). In an example, the display device 1310, input device 1312, and UI navigation device 1314 may be a touch screen display. The machine 1300 may additionally include a mass storage (e.g., drive unit) 1321, a signal generation device 1318 (e.g., a speaker), a network interface device 1320, and one or more sensors 1316, such as a global positioning system (GPS) sensor, compass, accelerometer, or other sensor. The machine 1300 may include an output controller 1328, such as a serial (e.g., USB, parallel, or other wired or wireless (e.g., infrared (IR), near field communication (NFC), etc.) connection to communicate or control one or more peripheral devices (e.g., a printer, card reader, etc.).

The machine 1300 may include a machine-readable medium 1322 on which is stored one or more sets of data structures or instructions 1324 (e.g., software) embodying or utilized by any one or more of the techniques or functions described herein. The instructions 1324 may also reside, completely or at least partially, within the main memory 1304, within the static memory 1306, within the mass storage 1321, or within the processor 1302 during execution thereof by the machine 1300. In an example, one or any combination of the processor 1302, the main memory 1304, the static memory 1306, or the mass storage 1321 may constitute the machine-readable medium 1322.

While the machine-readable medium 1322 is illustrated as a single medium, the term "machine-readable medium" may include a single medium or multiple media (e.g., a centralized or distributed database, or associated caches and servers) configured to store the one or more instructions 1324.

The term "machine-readable medium" may include any medium that is capable of storing, encoding, or carrying instructions for execution by the machine 1300 and that cause the machine 1300 to perform any one or more of the techniques of the present disclosure, or that is capable of storing, encoding or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

The instructions 1324 (e.g., software, programs, an operating system (OS), etc.) or other data are stored on the mass storage 1321, can be accessed by the memory 1304 for use by the processor 1302. The memory 1304 (e.g., DRAM) is typically fast, but volatile, and thus a different type of storage than the mass storage 1321 (e.g., an SSD), which is suitable for long-term storage, including while in an "off" condition. The instructions 1324 or data in use by a user or the machine 1300 are typically loaded in the memory 1304 for use by the processor 1302. When the memory 1304 is full, virtual space from the mass storage 1321 can be allocated to supplement the memory 1304; however, because the mass storage 1321 is typically slower than the memory 1304, and write speeds are typically at least twice as slow as read speeds, use of virtual memory can greatly reduce user experience due to storage device latency (in contrast to the memory 1304, e.g., DRAM). Further, use of the mass storage 1321 for virtual memory can greatly reduce the usable lifespan of the mass storage 1321.

In contrast to virtual memory, virtual memory compression (e.g., the Linux® kernel feature "ZRAM") uses part of the memory as compressed block storage to avoid paging to the mass storage 1321. Paging takes place in the compressed block until it is appropriate to write such data to the mass storage 1321. Virtual memory compression increases the usable size of memory 1304, while reducing wear on the mass storage 1321.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival SATA based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

The instructions 1324 may further be transmitted or received over a communications network 1326 using a transmission medium via the network interface device 1320 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1320 may include one or more physical jacks (e.g., Ethernet, coaxial, or phone jacks) or one or more antennas to connect to the communications network 1326. In an example, the network interface device 1320 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of storing, encoding or carrying instructions for execution by the machine 1300, and includes instrumentalities to propagate digital or analog communications signals or other tangible medium to facilitate communication of such software.

The following are example embodiments of devices and methods, in accordance with the teachings herein.

An example high-voltage switch circuit 1 can comprise: a first high-voltage transistor having a first gate separated from a channel structure by a dielectric region, the first high-voltage transistor coupled to receive a high voltage from a high-voltage node of the high-voltage switch circuit; a second high-voltage transistor coupled to the first high-voltage transistor, the second high-voltage transistor coupled to receive a version of an input signal to the high-voltage switch circuit; an output node disposed between and coupled to the first high-voltage transistor and the second high-voltage transistor, with the output node coupled to transfer a voltage from the first high-voltage transistor externally from the high-voltage switch circuit; and a diode structure having a first node coupled to the output node and a second node coupled to the first gate.

An example high-voltage switch circuit 2 can include features of example high-voltage switch circuit 1 and can include a third high-voltage transistor coupling the first high-voltage transistor to the high-voltage node, the third high-voltage transistor having a second gate coupled to the output node.

An example high-voltage switch circuit 3 can include features of any of the preceding example high-voltage switch circuits and can include the diode structure including one or more field effect transistors in diode mode.

An example high-voltage switch circuit 4 can include features of any of the preceding example high-voltage switch circuits and can include the first high-voltage transistor being coupled to a rail network to allow initial grounding of the first gate during initiation of the high-voltage switch circuit to an on-status.

An example high-voltage switch circuit 5 can include features of example high-voltage switch circuit 4 and any of the preceding example high-voltage switch circuits and can include the high-voltage switch circuit to include: a second diode structure to couple to the rail network; and a third high-voltage transistor and a fourth high-voltage transistor arranged in parallel to each other, the third high-voltage transistor and the fourth high-voltage coupling the first high-voltage transistor to the high-voltage node, the third high-voltage transistor having a second gate coupled to the output node.

An example high-voltage switch circuit 6 can include features of example high-voltage switch circuit 4 and any of the preceding example high-voltage switch circuits and can include a fifth high-voltage transistor having a gate coupled to receive a rail voltage and an input switchable between the rail voltage and 0V, with the fifth high-voltage transistor coupled to the first transistor.

An example high-voltage switch circuit 7 can include features of any of the preceding example high-voltage switch circuits and can include control circuitry to control timing of the input signal and a second input signal to prevent voltage across the dielectric region from entering a Fowler-Nordheim regime.

An example high-voltage switch circuit 8 can include features of any of the preceding example high-voltage switch circuits and can include a sensing circuit to prevent voltage across the dielectric region from entering a Fowler-Nordheim regime, with the sensing circuit arranged to detect either voltage on the output node or an onset of current through the diode structure and to generate a second input signal to a fifth high-voltage transistor coupled to the first high-voltage transistor.

In an example high-voltage switch circuit 9, any of the high-voltage switch circuits of example high-voltage switch circuits 1 to 8 may be operable with memory devices associated with example systems comprising a host processor and a communication bus extending between the host processor and the memory device.

In an example high-voltage switch circuit 10, any of the high-voltage switch circuits of example high-voltage switch circuits 1 to 9 may be modified to include any structure presented in another example high-voltage switch circuit of example high-voltage switch circuits 1 to 9.

In an example high-voltage switch circuit 11, any apparatus associated with the example high-voltage switch circuit of example high-voltage switch circuits 1 to 10 may further include a machine-readable storage device configured to store instructions as a physical state, wherein the instructions may be used to perform one or more operations of the apparatus.

In an example high-voltage switch circuit 12, any of the high-voltage switch circuits of example high-voltage switch circuits 1 to 11 may be adapted and operated to perform operations in accordance with any of the methods of the following example methods 1-5.

An example memory device 1 can comprise: a group of memory cells; and a high-voltage switch circuit to provide a voltage to one or more access lines coupled to the group of memory cells, the high-voltage switch circuit including: a p-channel field effect transistor, the p-channel field effect transistor having a first gate separated from a channel structure by a dielectric region, the p-channel field effect transistor being a high-voltage transistor coupled to a high-voltage node of the high-voltage switch circuit; a n-channel field effect transistor coupled to the p-channel field effect transistor, the n-channel field effect transistor being a high-voltage transistor coupled to receive a complement of an input signal to the high-voltage switch circuit; an output node coupled to the p-channel field effect transistor and the n-channel field effect transistor, the output node disposed between the p-channel field effect transistor and the n-channel field effect transistor, with the output node coupled to transfer the voltage from the p-channel field effect transistor directed to the one or more access lines; and a diode structure having a first node coupled to the output node and a second node coupled to the first gate; and control circuitry to control timing of signals to the high-voltage switch circuit to prevent voltage across the dielectric region from entering a Fowler-Nordheim regime.

An example memory device 2 can include features of example memory device 1 and can include the high-voltage switch circuit including a high-voltage depletion n-channel field effect transistor coupled to the p-channel field effect transistor and to the high-voltage node, the high-voltage depletion n-channel field effect transistor having a second gate coupled to the output node.

An example memory device 3 can include features of any of the preceding example memory devices and can include the diode structure including one or more n-channel field effect transistors in diode mode.

An example memory device 4 can include features of any of the preceding example memory devices and can include the high-voltage switch circuit including: a second diode structure coupled to receive a fixed input signal and coupled to the first gate; and a first high-voltage depletion n-channel field effect and a second high-voltage depletion n-channel field effect arranged in parallel to each other with the first and second high-voltage depletion n-channel field effects coupled to the p-channel field effect transistor and coupled to the high-voltage node, the first high-voltage depletion n-channel field effect having a second gate coupled to the output node and the second high-voltage depletion n-channel field effect having a second gate coupled to receive the complement of the input signal.

An example memory device 5 can include features of any of the preceding example memory devices and can include the high-voltage switch circuit including a second high-voltage n-channel field effect transistor coupled to the diode structure and to the first gate, the second high-voltage n-channel field effect transistor having a gate coupled to receive the fixed voltage and having a drain coupled to receive one of the input signals controlled by the control circuitry.

An example memory device 6 can include features of any of the preceding example memory devices and can include the high-voltage switch circuit including: a second high-voltage n-channel field effect transistor coupled to the first gate, the second high-voltage n-channel field effect transistor having a gate coupled to a fixed input signal and having a drain coupled to receive the input signal; and a first high-voltage depletion n-channel field effect and a second high-voltage depletion n-channel field effect arranged in parallel to each other with the first and second high-voltage depletion n-channel field effects coupled to the p-channel field effect transistor and coupled to the high-voltage node, the first high-voltage depletion n-channel field effect having a second gate coupled to the output node and the second high-voltage depletion n-channel field effect having a second gate coupled to receive the complement of the input signal.

An example memory device 7 can include features of example memory device 6 and features of any of the preceding example memory devices and can include the input signal changing between a voltage of the fixed input signal or zero volts.

In an example memory device 8, any of the memory devices of example memory devices 1 to 7 may include memory devices incorporated into an electronic memory device further comprising a host processor and a communication bus extending between the host processor and the memory device.

In an example memory device 9, any of the memory devices of example memory devices 1 to 8 may be modified to include any structure presented in another example memory device of example memory devices 1 to 8.

In an example memory device 10, any apparatus of any of the memory devices of example memory devices 1 to 9 may further include a machine-readable storage device configured to store instructions as a physical state, wherein the instructions may be used to perform one or more operations of the apparatus.

In an example memory device 11, any of the memory devices of example memory devices 1 to 10 may be adapted and operated to perform operations in accordance with any of the methods of the following example methods 1-5.

An example method 1 of controlling a high-voltage switch can comprise: receiving a low voltage input at the high-voltage switch, the high-voltage switch having a first high-voltage transistor that is coupled to a second high-voltage transistor, the first high-voltage transistor having a first gate separated from a channel structure by a dielectric region; transferring a high voltage from an output node of the high-voltage switch, the output node coupled to and disposed between the first high-voltage transistor and the second high-voltage transistor, with the second high-voltage transistor coupled to receive a complement of the low voltage input and the first high-voltage transistor coupled to access a source of the high voltage; and preventing voltage across the dielectric region from entering a Fowler-Nordheim regime by using feedback from the output node to a gate of the first high-voltage transistor through a diode structure.

An example method 2 of controlling a high-voltage switch can include features of example method 1 of controlling a high-voltage switch and can include taking an input voltage coupled to a third high-voltage transistor, coupled to the gate of the first high-voltage transistor, to ground for a period when the low voltage input switches to ground and switching the input voltage to the third high-voltage transistor back to a low bias voltage before voltage at the output node reaches a threshold voltage of the diode structure.

An example method 3 of controlling a high-voltage switch can include features of any of the preceding example methods of controlling a high-voltage switch and can include starting the feedback by applying the complement of the low voltage input to a first gate of a first high-voltage depletion transistor arranged in parallel to a second high-voltage depletion transistors, with the first and second high-voltage depletion transistors coupled to the first high-voltage transistor and coupled to the source of the high-voltage, the second high-voltage depletion transistor having a second gate coupled to the output node.

An example method 4 of controlling a high-voltage switch can include features of any of the preceding example methods of controlling a high-voltage switch and can include discharging gate capacitance of the first high-voltage transistor through a node coupled to the source of the high voltage.

An example method 5 of controlling a high-voltage switch can include features of any of the preceding example methods of controlling a high-voltage switch and can include further discharging the gate capacitance through a biasing high-voltage transistor coupled to the gate of the first high-voltage transistor, after discharging gate capacitance through the node coupled to the source of the high voltage.

In an example method 6 of controlling a high-voltage switch, any of the example methods 1-5 of controlling a high-voltage switch may be performed by an electronic system including a host processor and a communications interface extending between the host processor and a memory device.

In an example method 7 of controlling a high-voltage switch, any of the example methods 1-6 of controlling a high-voltage switch may be modified to include operations set forth in any other of method examples 1-8 of controlling a high-voltage switch.

In an example method 8 of controlling a high-voltage switch, any of the example methods 1-7 of controlling a high-voltage switch may be implemented at least in part through use of instructions stored as a physical state in one or more machine-readable storage devices.

An example method 9 of controlling a high-voltage switch can include features of any of the preceding example methods 1-8 of controlling a high-voltage switch and can include performing functions associated with any features of example high-voltage switch circuits 1 to 12 and example memory devices 1-11.

An example machine-readable storage device 1 storing instructions, that when executed by one or more processors, cause a machine to perform operations, can comprise instructions to perform functions associated with any features of example high-voltage switch circuits 1 to 12 and example memory devices 1-11 or perform methods associated with any features of example methods 1-9.

In various examples, the components, controllers, processors, units, engines, or tables described herein can include, among other things, physical circuitry or firmware stored on a physical device. As used herein, "processor device" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, RAMs, ROMs, SSDs, UFS devices, eMMC devices, and the like.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. The above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. Combinations of the above embodiments and other embodiments will be apparent to those of skill in the art upon studying the above description.

What is claimed is:

1. An electronic device comprising:
a switch circuit structured as a high-voltage switch circuit in the electronic device, the switch circuit comprising:
a transistor having a first gate separated from a channel structure by a dielectric region, the transistor coupled to receive a voltage from a node of the switch circuit, the voltage being a high voltage for the electronic device;
an output node coupled to the transistor, with the output node coupled to transfer the voltage from the transistor externally from the switch circuit;
a diode structure coupled to the output node and to the first gate, the diode structure being a feedback structure arranged to provide feedback to the transistor from the output node; and
control circuitry structured to control timing of an input signal to the transistor such that voltage across the dielectric region is operatively prevented from entering a Fowler-Nordheim regime.

2. The electronic device of claim 1, wherein the electronic includes:
a low voltage source; and
a high-voltage transistor coupled to the output node and coupled to the low voltage source to receive a complement of voltage from the low voltage source, the high-voltage transistor being a carrier-type transistor different from the transistor having the first gate.

3. The electronic device of claim 1, wherein the transistor is coupled to the node by a high voltage transistor having a gate coupled to the output node.

4. The electronic device of claim 1, wherein the switch circuit includes the gate of the transistor coupled to a low voltage source.

5. The electronic device of claim 1, wherein the transistor, having the first gate, is coupled to the node by two transistors arranged in parallel to each other, one of the two transistors having a gate coupled to the output node and the other one of the two transistors having a gate coupled to a low voltage source to receive a complement of an input voltage to the switch circuit.

6. The electronic device of claim 1, wherein the control circuitry includes a sensing circuit arranged to detect voltage on the output node.

7. The electronic device of claim 1, wherein the control circuitry includes a sensing circuit arranged to detect onset of current through the diode structure.

8. The electronic device of claim 1, wherein the diode structure includes one or more field effect transistors in diode mode.

9. The electronic device of claim 1, wherein the electronic device includes a memory device in which the switch circuit is integrated.

10. The electronic device of claim 1, wherein the electronic device includes a rail network to provide a fixed non-zero input signal to the switch circuit.

11. A memory device comprising:
a group of memory cells; and
a high-voltage switch circuit to provide a voltage to one or more access lines coupled to the group of memory cells, the high-voltage switch circuit including:
a transistor having a first gate separated from a channel structure by a dielectric region, the transistor coupled to receive a voltage from a node of the switch circuit, the voltage being a high voltage for the memory device;
an output node coupled to the transistor, with the output node coupled to transfer the voltage from the transistor externally from the switch circuit;
a diode structure coupled to the output node and to the first gate, the diode structure being a feedback structure arranged to provide feedback to the transistor from the output node; and
control circuitry structured to control timing of an input signal to the transistor such that voltage across the dielectric region is operatively prevented from entering a Fowler-Nordheim regime.

12. The memory device of claim 11, wherein the transistor is a high voltage p-type field effect transistor.

13. The memory device of claim 12, wherein the high-voltage switch circuit includes a high voltage n-type field effect transistor connected to the high voltage p-type field effect transistor and to the output node.

14. The memory device of claim 11, wherein the diode structure includes one or more high voltage field effect transistors in diode mode.

15. The memory device of claim 11, wherein the transistor, having the first gate, is coupled to the node by a second transistor having a second gate coupled to the output node, the second transistor being a high voltage depletion mode transistor having a n-channel structure.

16. A method of operating a high-voltage switch, the method comprising:
receiving a low voltage input at the high-voltage switch, the high-voltage switch having a high-voltage transistor having a gate separated from a channel structure by a dielectric region, the high-voltage transistor coupled to access a source of high voltage;
transferring a high voltage from an output node of the high-voltage switch, the output node coupled to the high-voltage transistor; and
preventing voltage across the dielectric region from entering a Fowler-Nordheim regime by using feedback from the output node to a gate of the high-voltage transistor through a diode structure coupled to the output node.

17. The method of claim 16, wherein the method includes initial grounding of the gate during initiation of the high-voltage switch to an on-status using a rail network to which the high-voltage transistor is coupled.

18. The method of claim 16, wherein the method includes starting the feedback by applying a complement of the low voltage input to a first gate of a first high-voltage depletion transistor arranged in parallel to a second high-voltage depletion transistor, with the first and second high-voltage depletion transistors coupled to the first high-voltage transistor and coupled to the source of the high-voltage, the second high-voltage depletion transistor having a second gate coupled to the output node.

19. The method of claim 16, wherein the method includes:
discharging gate capacitance of the high-voltage transistor through a node coupled to the source of the high voltage; and
further discharging the gate capacitance through a biasing high-voltage transistor coupled to the gate of the high-voltage transistor, after discharging gate capacitance through the node coupled to the source of the high voltage.

20. The method of claim 16, wherein preventing voltage across the dielectric region from entering the Fowler-Nordheim regime includes using a sense circuit to detect voltage on the output node being greater than a constant voltage plus a threshold voltage of the high-voltage transistor or to detect onset of current through the diode structure.

\* \* \* \* \*